US011963382B2

(12) United States Patent
Yu et al.

(10) Patent No.: US 11,963,382 B2
(45) Date of Patent: Apr. 16, 2024

(54) DISPLAY SUBSTRATE AND PREPARATION METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Pengfei Yu, Beijing (CN); Chenxing Wan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 563 days.

(21) Appl. No.: 17/265,193

(22) PCT Filed: Apr. 21, 2020

(86) PCT No.: PCT/CN2020/085889
§ 371 (c)(1),
(2) Date: Feb. 1, 2021

(87) PCT Pub. No.: WO2021/212313
PCT Pub. Date: Oct. 28, 2021

(65) Prior Publication Data
US 2022/0115625 A1    Apr. 14, 2022

(51) Int. Cl.
*H01L 51/52*    (2006.01)
*H01L 21/02*    (2006.01)
(Continued)

(52) U.S. Cl.
CPC ......... *H10K 50/844* (2023.02); *H10K 59/126* (2023.02); *H10K 59/131* (2023.02);
(Continued)

(58) Field of Classification Search
None
See application file for complete search history.

(56) References Cited

U.S. PATENT DOCUMENTS

2003/0183830 A1    10/2003    Yamazaki et al.
2018/0097034 A1    4/2018    Lee et al.
(Continued)

FOREIGN PATENT DOCUMENTS

CN    107887417 A    4/2018
CN    110010662 A    7/2019
(Continued)

*Primary Examiner* — Asok K Sarkar
(74) *Attorney, Agent, or Firm* — Ling Wu; Stephen Yang; Ling and Yang Intellectual Property

(57) ABSTRACT

Provided are a display substrate and a preparation method thereof, and a display device. A display region and a binding region located at one side of the display region are comprised. The display region comprises a driving structure layer, an organic insulating layer disposed on the driving structure layer and a light-emitting element disposed on the organic insulating layer, the driving structure layer comprises a pixel driving circuit, and the light-emitting element is connected with the pixel driving circuit. The binding region comprises a binding structure layer, an organic insulating layer and an isolation dam disposed on the binding structure layer, and an inorganic encapsulation layer disposed on the organic insulating layer and the isolation dam, the binding structure layer comprises a power line connected with the pixel driving circuit; at least one isolation groove is disposed on the organic insulating layer of the binding region.

18 Claims, 10 Drawing Sheets

(51) Int. Cl.
*H10K 50/844* (2023.01)
*H10K 59/126* (2023.01)
*H10K 59/131* (2023.01)
*H10K 71/00* (2023.01)
*H10K 71/80* (2023.01)
*H10K 77/10* (2023.01)
H10K 59/12 (2023.01)
H10K 102/00 (2023.01)

(52) U.S. Cl.
CPC ............. *H10K 71/00* (2023.02); *H10K 71/80* (2023.02); *H10K 77/111* (2023.02); H10K 59/1201 (2023.02); H10K 2102/311 (2023.02)

(56) References Cited

U.S. PATENT DOCUMENTS

| | | |
|---|---|---|
| 2019/0214446 A1 | 7/2019 | Kim |
| 2019/0305072 A1 | 10/2019 | Park et al. |
| 2020/0083306 A1 | 3/2020 | Choi et al. |

FOREIGN PATENT DOCUMENTS

| | | |
|---|---|---|
| CN | 110364550 A | 10/2019 |
| CN | 110880524 A | 3/2020 |
| CN | 110993821 A | 4/2020 |
| KR | 10-2019-0065757 A | 6/2019 |

# DISPLAY SUBSTRATE AND PREPARATION METHOD THEREOF, AND DISPLAY DEVICE

CROSS-REFERENCE TO RELATED APPLICATION

The present application is a U.S. National Phase Entry of International Application No. PCT/CN2020/085889 having an international filing date of Apr. 21, 2020. The above-identified application is incorporated into this application by reference in their entirety.

TECHNICAL FIELD

The present disclosure relates to, but is not limited to, the field of display technology, in particular to a display substrate and a preparation method thereof, and a display device.

BACKGROUND

An Organic light-emitting Diode (OLED) is an active light-emitting display device, and has advantages of self-emission, wide view, high contrast, low power consumption, extremely high response speed, etc. With the continuous development of display technology, the Flexible Display device with OLED as a light-emitting device and film Transistor (TFT) to perform signal control has become the mainstream product in the display field.

SUMMARY

The following is a summary of subject matter described in detail herein. This summary is not intended to limit the protection scope of the claims.

In one aspect, the present disclosure provides a display substrate including a display region and a binding region located at one side of the display region. The display region includes a driving structure layer, an organic insulating layer disposed on the driving structure layer, a light-emitting element disposed on the organic insulating layer and a composite encapsulation layer disposed on the light-emitting element. The driving structure layer includes a pixel driving circuit, and the light-emitting element is connected with the pixel driving circuit. The binding region includes a binding structure layer, an organic insulating layer and an isolation dam disposed on the binding structure layer, and an inorganic encapsulation layer disposed on the organic insulating layer and the isolation dam. The binding structure layer includes a power line connected with the pixel driving circuit. At least one isolation groove is disposed on the organic insulating layer of the binding region, the inorganic encapsulation layer covers the isolation groove and wraps the isolation dam, and the distance between the isolation groove and an edge of the display region is smaller than that between the isolation dam and the edge of the display region.

In some possible implementations, the isolation dam includes a first isolation dam and a second isolation dam, and the distance between the first isolation dam and the edge of the display region is smaller than that between the second isolation dam and the edge of the display region; and the distance between the isolation groove and the edge of the display region is smaller than that between the first isolation dam and the edge of the display region.

In some possible implementations, the light-emitting element includes the anode, a pixel definition layer, an organic light-emitting layer and a cathode, wherein the pixel definition layer and the cathode extend to the binding region. Along the direction away from the display region, the distance between a cathode edge and the edge of the display region in the binding region is smaller than the distance between the isolation groove and the edge of the display region.

In some possible implementations, the width of the isolation groove is 20 µm to 70 µm along the direction away from the display region.

In some possible implementations, the power line includes a first power line and a second power line, and the isolation groove is disposed on the first power line, or disposed on the second power line, or disposed between the first power line and the second power line.

In some possible implementations, along the direction of the edge of the display region, an orthographic projection of the isolation groove on the substrate includes an orthographic projection of the first power line on the substrate.

In some possible implementations, the display substrate further includes an edge region which includes a circuit structure layer and an organic insulating layer disposed on the circuit structure layer, wherein a gap is disposed on the organic insulating layer, and the isolation groove of the binding region is communicated with the gap of the edge region.

In some possible implementations, the first power line includes a first strip block and a second strip block, wherein the first strip block extends along the direction of the edge of the display region, and the second strip block extends along the direction away from the display region. One end of the second strip block adjacent to the display region is connected with the first strip block to form a T-shaped structure. The second power line is located at one side of the first strip block away from the display region, the isolation dam is disposed on the second strip block and the second power line, and the isolation groove is disposed on the first strip block.

In some possible implementations, the binding structure layer of the binding region includes a composite insulating layer disposed on the substrate and the first power line and the second power line disposed on the composite insulating layer. Optionally, the binding structure layer of the binding region includes a composite insulating layer disposed on the substrate, the first power line and the second power line disposed on the composite insulating layer, and a fifth insulating layer disposed on the first power line and the second power line. The organic insulating layer disposed on the binding structure layer includes a first flat layer. The composite insulating layer includes a first insulating layer, a second insulating layer, a third insulating layer and a fourth insulating layer which are stacked on the substrate.

In some possible implementations, the binding structure layer of the binding region includes a composite insulating layer disposed on the substrate, a fifth insulating layer disposed on the composite insulating layer, a first flat layer disposed on the fifth insulating layer, and first and second power lines disposed on the first flat layer. Optionally, the binding structure layer of the binding region includes a composite insulating layer disposed on the substrate, first and second power lines disposed on the composite insulating layer, a fifth insulating layer disposed on the first and second power lines and a first flat layer disposed on the fifth insulating layer. Optionally, the binding structure layer of the binding region includes a composite insulating layer disposed on the substrate, second and third connection electrodes disposed on the composite insulating layer, a fifth insulating layer covering the second and third connection electrodes, a first flat layer disposed on the fifth insulating layer, and first and second power lines disposed on the first flat layer, wherein the first power line is connected with the second connection electrode through a via, and the second power line is connected with the third connection electrode through a via. The organic insulating layer disposed on the binding structure layer includes a second flat layer. The composite insulating layer includes a first insulating layer, a second insulating layer, a third insulating layer and a fourth insulating layer which are stacked on the substrate.

In some possible implementations, the edge of the power line is provided with a wave structure, wherein the wave structure is disposed on the edge of the power line on one side of the isolation groove away from the display region, or the wave structure is disposed on the edge of the power line on one side of the isolation dam away from the display region, or the wave structure is disposed on the edge of the power line in the area where the power line overlaps with the isolation dam.

In some possible implementations, the wave structure includes a plurality of protrusions disposed at intervals, and the protrusion height of the protrusions is 30 µm to 60 µm.

In another aspect, the present disclosure also provides a preparation method of a display substrate, which includes a display region and a binding region located at one side of the display region, and the preparation method includes: forming a driving structure layer and a binding structure layer in the display region and the binding region respectively, wherein the driving structure layer includes a pixel driving circuit, and the binding structure layer includes a power line connected with the pixel driving circuit; forming an organic insulating layer on the driving structure layer and the binding structure layer, wherein at least one isolation groove is formed on the organic insulating layer on the binding structure layer; forming a light-emitting element and an isolation dam in the display region and the binding region respectively, wherein the light-emitting element is connected with the pixel driving circuit, and the distance between the isolation groove and an edge of the display region is smaller than the distance between the isolation dam and the edge of the display region; and forming an inorganic encapsulation layer in the binding region, wherein the inorganic encapsulation layer covers the isolation groove and wraps the isolation dam.

In some possible implementations, forming a light-emitting element and an isolation dam in the display region and the binding region respectively includes: forming a light-emitting element in the display region, wherein the light-emitting element is connected with the pixel driving circuit; forming a first isolation dam and a second isolation dam in the binding region, wherein the distance between the first isolation dam and the edge of the display region is smaller than that between the second isolation dam and the edge of the display region, and the distance between the isolation groove and the edge of the display region is smaller than that between the first isolation dam and the edge of the display region.

In some possible implementations, forming a light-emitting element in the display region includes: sequentially forming an anode, a pixel definition layer, an organic light-emitting layer and a cathode on the organic insulating layer, wherein the anode is connected with the pixel driving circuit, the pixel definition layer and the cathode extend to the binding region; along the direction away from the display region, the distance between the cathode edge and the edge of the display region in the binding region is smaller than that between the isolation groove and the edge of the display region.

In some possible implementations, the power line includes a first power line and a second power line, and the isolation groove is disposed on the first power line, or disposed on the second power line, or disposed between the first power line and the second power line. The width of the isolation groove is 20 µm to 70 µm along the direction away from the display region.

In some possible implementations, the display substrate further includes an edge region, and the preparation method further includes: forming a circuit structure layer on the edge region, forming an organic insulating layer on the circuit structure layer, wherein at least one gap is formed on the organic insulating layer, and the isolation groove of the binding region is communicated with the gap of the edge region and formed by the same process.

In some possible implementations, the binding structure layer of the binding region includes a composite insulating layer disposed on the substrate and a first power line and a second power line disposed on the composite insulating layer. Optionally, the binding structure layer of the binding region includes a composite insulating layer disposed on the substrate, a first power line and a second power line disposed on the composite insulating layer and a fifth insulating layer disposed on the first power line and the second power line. Optionally, the binding structure layer of the binding region includes a composite insulating layer disposed on the substrate, a fifth insulating layer disposed on the composite insulating layer, a first flat layer disposed on the fifth insulating layer, and first and second power lines disposed on the first flat layer. Optionally, the binding structure layer of the binding region includes a composite insulating layer disposed on the substrate, a first power line and a second power line disposed on the composite insulating layer, a fifth insulating layer disposed on the first power line and the second power line, and a first flat layer disposed on the fifth insulating layer. Optionally, the binding structure layer of the binding region includes a composite insulating layer disposed on the substrate, second and third connection electrodes disposed on the composite insulating layer, a fifth insulating layer covering the second and third connection electrodes, a first flat layer disposed on the fifth insulating layer, and first and second power lines disposed on the first flat layer, wherein the first power line is connected with the second connection electrode through a via, and the second power line is connected with the third connection electrode through a via. The organic insulating layer disposed on the binding structure layer includes a first flat layer or includes a second flat layer. The composite insulating layer includes a first insulating layer, a second insulating layer, a third insulating layer and a fourth insulating layer which are stacked on the substrate.

In some possible implementations, the edge of the power line is provided with a wave structure, the wave structure is disposed on the edge of the power line on one side of the isolation groove away from the display region, or the wave structure is disposed on the edge of the power line on one side of the isolation dam away from the display region, or the wave structure is disposed on the edge of the power line in the overlapping area between the power line and the isolation dam. The wave structure includes a plurality of protrusions disposed at intervals, and the protrusion height of the protrusions is 30 µm to 60 µm.

In another aspect, the present disclosure further provides a display device, including the aforementioned display substrate.

Other aspects will become apparent upon reading and understanding the accompanying drawings and the detailed description.

BRIEF DESCRIPTION OF DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure. Shapes and sizes of the components in the drawings do not reflect true proportions, and the purpose is only for schematically describing contents of the present disclosure.

ILLUSTRATION OF REFERENCE SIGNS

Figure 1:
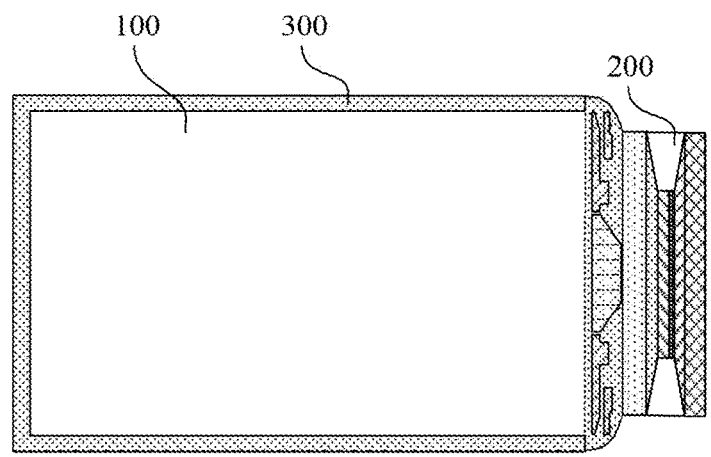
FIG. 1 is a schematic structural diagram of a display substrate according to the present disclosure.

1—glass carrier plate; 10—flexible substrate; 11—first insulating layer;
12—second insulating layer; 13—third insulating layer; 14—fourth insulating layer;
15—first flat layer; 16—fifth insulating layer; 17—second flat layer;
21—anode; 22—pixel definition layer; 23—organic light-emitting layer;
24—cathode; 25—first encapsulation layer; 26—second encapsulation layer;
27—third encapsulation layer; 30—flat dam foundation; 31—first dam foundation;
32—second dam foundation; 33—post spacer; 100—display region;
101—first transistor; 102—first storage capacitor; 103—second transistor;
104—third transistor; 105—second storage capacitor; 106—third storage capacitor;
110—edge of the display region; 200—binding region; 201—first fan-out area;
202—bending area; 203—second fan-out area; 204—anti-static area;
205—drive chip area; 206—binding electrode area; 210—first power line;
220—second power line; 230—wave structure; 300—edge region;
410—first isolation dam; 420—second isolation dam; 500—isolation groove;
600—isolation area; 700—gap; 801—first connection electrode;
802—second connection electrode; 803—third connection electrode;
804—fourth connection electrode; 2101—first strip block; 2102—second strip block;
2201—third strip block; 2202—fourth strip block.

DETAILED DESCRIPTION

To make the objects, technical solutions and advantages of the present disclosure more clear, embodiments of the present disclosure will be described in detail below with reference to the accompanying drawings. Note that the embodiments herein may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, the size of a constituent element, or the thickness or area of a layer, is sometimes exaggerated for clarity. Therefore, an implementation of the present disclosure is not necessarily limited to the size shown, and shapes and sizes of the components in the drawings do not reflect true proportions. In addition, the drawings schematically show ideal examples, and an implementation of the present disclosure is not limited to the shapes or values shown in the drawings.

The "first", "second", "third" and other ordinal numbers in the present description are used to avoid confusion of constituent elements, but not to limit in quantity.

In the present description, for convenience, words such as "middle", "upper", "lower", "front", "rear", "vertical", "horizontal", "top", "bottom", "inner" and "outer", which indicate the orientational and positional relationship, describe the positional relationship of the components with reference to the drawings, only for convenience of describing the present description and simplifying the description, but not for indicating or implying that the device or element referred to must have a specific orientation, or must be constructed and operated in a specific orientation, therefore, they cannot be understood as a limitation of the present disclosure. The positional relationship of the components is appropriately changed according to the direction in which the components are described. Therefore, it is not limited to the words or sentences described in the description, and can be replaced as appropriate according to the situation.

In the present description, the terms "installed", "connected" and "coupled" shall be broadly understood unless otherwise explicitly specified and defined. For example, it may be fixedly connected, or may be removable connected, or integrally connected; it may be mechanically connected, or may be electrically connected; it may be directly connected, or may be indirectly connected through middleware, or may be internal connection between two elements. For those of ordinary skill in the art, the specific meanings of the above terms in the present disclosure may be understood according to a specific situation.

In the present description, transistor refers to an element including at least three terminals, namely, a gate electrode, a drain electrode and a source electrode. A transistor has a channel region between a drain electrode (drain electrode terminal, drain region or drain electrode) and a source electrode (source electrode terminal, source region or source electrode), and current can flow through the drain electrode, channel region and source electrode. Note that in the present description, channel region refers to a region through which current mainly flows.

In the present description, the first electrode may be a drain electrode and the second electrode may be a source electrode, or the first electrode may be a source electrode and the second electrode may be a drain electrode. The functions of the "source electrode" and the "drain electrode" are sometimes interchanged when transistors with opposite polarities are used or when the current direction changes during circuit operation. Therefore, in the present description, "source electrode" and "drain electrode" can be interchanged.

In the present description, "electrical connection" includes a case where the components are connected together through an element having a certain electrical action. The "element having a certain electrical action" is not particularly limited as long as it can transmit and receive electrical signals between the connected components. Examples of "element having a certain electrical action" include not only electrodes and wiring, but also switching elements such as transistors, resistors, inductors, capacitors, and other elements with various functions.

In the present description, "parallel" refers to a state in which two straight lines form an angle of −10 degrees or more and 10 degrees or less, and thus also includes a state in which the angle is −5 degrees or more and 5 degrees or less. In addition, "vertical" refers to a state in which two straight lines form an angle of 80 degrees or more and 100 degrees or less, and thus also includes a state in which the angle is 85 degrees or more and 95 degrees or less.

In the present description, "film" and "layer" can be interchanged. For example, sometimes "conductive layer" can be replaced by "conductive film". Similarly, "insulating film" can sometimes be replaced by "insulating layer".

The "about" in the present disclosure means that the limit is not strictly set, and a value within the range of process and measurement errors is allowed.

A flexible display device includes a driving circuit layer disposed on a flexible substrate, a light-emitting device disposed on the driving circuit layer and an encapsulation layer disposed on the light-emitting device, wherein the encapsulation layer is used for protecting the light-emitting device. Research shows that the encapsulation effect of the encapsulation layer has great influence on the display performance of the flexible display device. If the encapsulation layer fails in encapsulating, for example, the encapsulation layer is cracked o broken, the moisture in the atmosphere will enter the light-emitting device along the gap, causing the organic material in the light-emitting device to oxidize and fail, thereby forming a failure region that cannot emit light. With the continuous invasion of moisture into the light-emitting device along the gap, the failure region gradually expands, resulting in poor display of the flexible display device, which is called Growing Dark Spot (GDS).

The present disclosure provides a display substrate including a display region and a binding region located at one side of the display region. The display region includes a driving structure layer, an organic insulating layer disposed on the driving structure layer, a light-emitting element disposed on the organic insulating layer and a composite encapsulation layer disposed on the light-emitting element. The driving structure layer includes a pixel driving circuit, and the light-emitting element is connected with the pixel driving circuit. The binding region includes a binding structure layer, an organic insulating layer and an isolation dam disposed on the binding structure layer, and an inorganic encapsulation layer disposed on the organic insulating layer and the isolation dam. The binding structure layer includes a power line connected with the pixel driving circuit. At least one isolation groove is disposed on the organic insulating layer of the binding region, the inorganic encapsulation layer covers the isolation groove and wraps the isolation dam, and the distance between the isolation groove and an edge of the display region is smaller than that between the isolation dam and the edge of the display region.

In an exemplary embodiment, the isolation dam includes a first isolation dam and a second isolation dam, and the distance between the first isolation dam and the edge of the display region is smaller than that between the second isolation dam and the edge of the display region; and the distance between the isolation groove and the edge of the display region is smaller than that between the first isolation dam and the edge of the display region.

In an exemplary embodiment, the light-emitting element includes an anode, a pixel definition layer, an organic light-emitting layer and a cathode, wherein the pixel definition layer and the cathode extend to the binding region. Along the direction away from the display region, the distance between the cathode edge and the edge of the display region is smaller than the distance between the isolation groove and the edge of the display region.

In an exemplary embodiment, the power line includes a first power line and a second power line, and the isolation groove is disposed on the first power line, or disposed on the second power line, or disposed between the first power line and the second power line. The width of the isolation groove is 20 µm to 70 µm along the direction away from the display region. Along the direction of the edge of the display region, an orthographic projection of the isolation groove on the substrate includes an orthographic projection of the first power line on the substrate.

In an exemplary embodiment, the display substrate further includes an edge region which includes a circuit structure layer and an organic insulating layer disposed on the circuit structure layer, a gap is disposed on the organic insulating layer, and the isolation groove of the binding region is communicated with the gap of the edge region and formed by the same process.

In an exemplary embodiment, the first power line includes a first strip block and a second strip block, wherein the first strip block extends along the direction of the edge of the display region, and the second strip block extends along the direction away from the display region. One end of the second strip block adjacent to the display region is connected with the first strip block to form a T-shaped structure. The second power line is located at one side of the first strip block away from the display region, the isolation dam is disposed on the second strip block and the second power line, and the isolation groove is disposed on the first strip block.

In an exemplary embodiment, the binding structure layer of the binding region includes a composite insulating layer disposed on the substrate and the first power line and the second power line disposed on the composite insulating layer. Optionally, the binding structure layer of the binding region includes a composite insulating layer disposed on the substrate, the first power line and the second power line disposed on the composite insulating layer, and a fifth insulating layer disposed on the first power line and the second power line. The organic insulating layer disposed on the binding structure layer includes a first flat layer. The composite insulating layer includes a first insulating layer, a second insulating layer, a third insulating layer and a fourth insulating layer which are stacked on the substrate.

In an exemplary embodiment, the binding structure layer of the binding region includes a composite insulating layer disposed on the substrate, a fifth insulating layer disposed on the composite insulating layer, a first flat layer disposed on the fifth insulating layer, and first and second power lines disposed on the first flat layer. Optionally, the binding structure layer of the binding region includes a composite insulating layer disposed on the substrate, first and second power lines disposed on the composite insulating layer, a fifth insulating layer disposed on the first and second power lines and a first flat layer disposed on the fifth insulating layer. Optionally, the binding structure layer of the binding region includes a composite insulating layer disposed on the substrate, second and third connection electrodes disposed on the composite insulating layer, a fifth insulating layer covering the second and third connection electrodes, a first flat layer disposed on the fifth insulating layer, and first and second power lines disposed on the first flat layer, wherein the first power line is connected with the second connection electrode through a via, and the second power line is connected with the third connection electrode through a via. The organic insulating layer disposed on the binding structure layer includes a second flat layer. The composite insulating layer includes a first insulating layer, a second insulating layer, a third insulating layer and a fourth insulating layer which are stacked on the substrate.

In an exemplary embodiment, the edge of the power line is provided with a wave structure, wherein the wave structure is disposed on the edge of the power line on one side of the isolation groove away from the display region, or the wave structure is disposed on the edge of the power line on one side of the isolation dam away from the display region, or the wave structure is disposed on the edge of the power line in the area where the power line overlaps with the isolation dam.

FIG. 1 is a schematic structural diagram of a display substrate according to the present disclosure. As shown in FIG. 1, the display substrate of the present disclosure includes a display region 100 and a non-display region located at the periphery of the display region 100, wherein the non-display region includes a binding region 200 located at one side of the display region 100 and an edge region 300 located at another side of the display region 100. The display region 100 at least includes a plurality of display units arranged regularly. The binding region 200 at least includes an isolation dam and a binding circuit connecting signal lines of the plurality of display units to an external driving device. The edge region 300 at least includes an isolation dam and a power line transmitting voltage signals to the plurality of display units. The isolation dams of the binding region 200 and the edge region 300 form an annular structure surrounding the display region 100.

Figure 2:
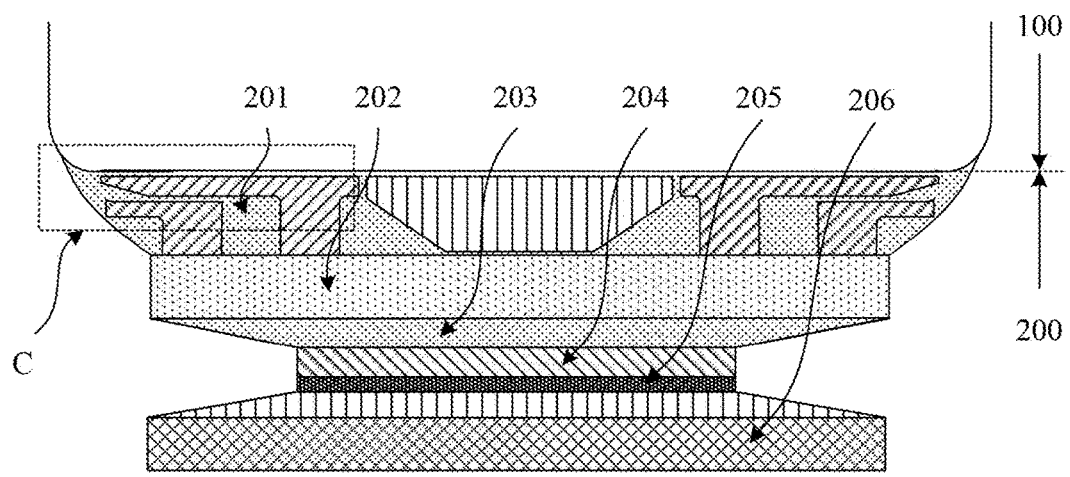
FIG. 2 is a schematic structural diagram of a binding region in a display substrate according to the present disclosure.

FIG. 2 is a schematic structural diagram of a binding region in a display substrate according to the present disclosure. As shown in FIG. 2, in the plane parallel to the display substrate, the binding region 200 of the present disclosure is located at one side of the display region 100, and the binding region 200 includes a first fan-out area 201, a bending area 202, a second fan-out area 203, an anti-static area 204, a drive chip area 205, and a binding electrode area 206 which are sequentially disposed along the direction away from the display region 100. The first fan-out area 201 includes a data fan-out line, a first power line and a second power line. The data fan-out line is located in the middle of the first fan-out area 201 and includes a plurality of data connection lines configured to connect Data Line of the display region 100 in a fan-out trace manner. The first power line is located on both sides of the data fan-out line and is configured to connect a high voltage power line (VDD) of the display region 100, and the second power line is also located on both sides of the data fan-out line and is configured to connect a low voltage power line (VSS) of the edge region 300. The bending area 202 includes a composite insulating layer provided with a groove, and is configured to bend the binding region 200 to the back of the display region 100. The second fan-out area 203 includes a plurality of data connection lines led out in a fan-out trace manner. The anti-static area 204 includes an anti-static circuit configured to prevent electrostatic damage of the display substrate by eliminating static electricity. The drive chip area 205 includes an Integrated Circuit (IC) configured to be connected with a plurality of data connection lines. The bonding electrode area 206 includes a plurality of Bonding Pad configured to be bonded and connected with an external Flexible Printed Circuit (FPC).

Figure 3:
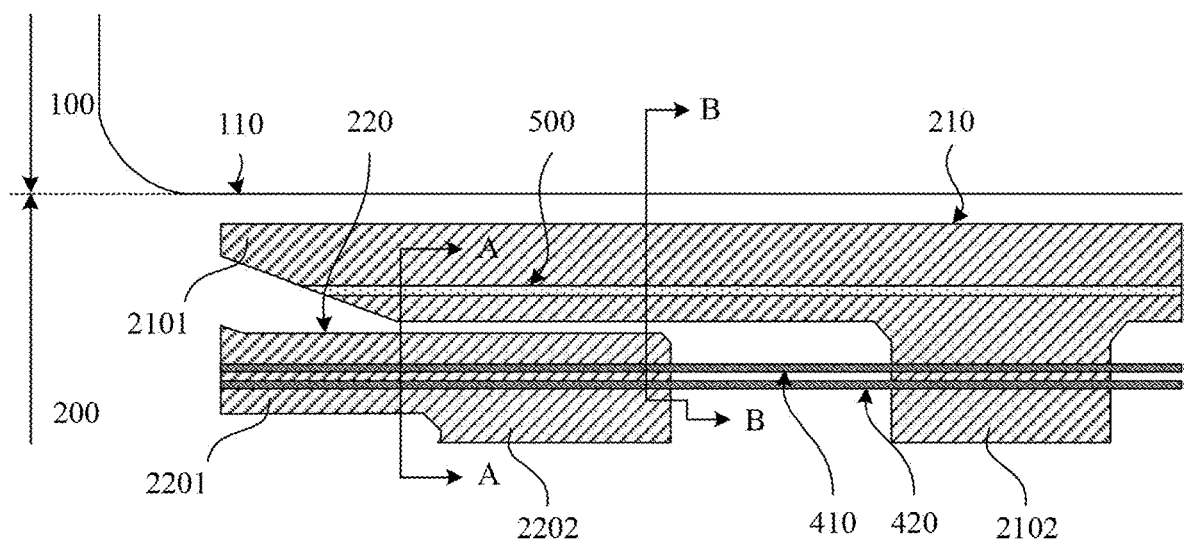
FIG. 3 is a schematic diagram of a structure of a first fan-out area according to the present disclosure.
Figure 4:
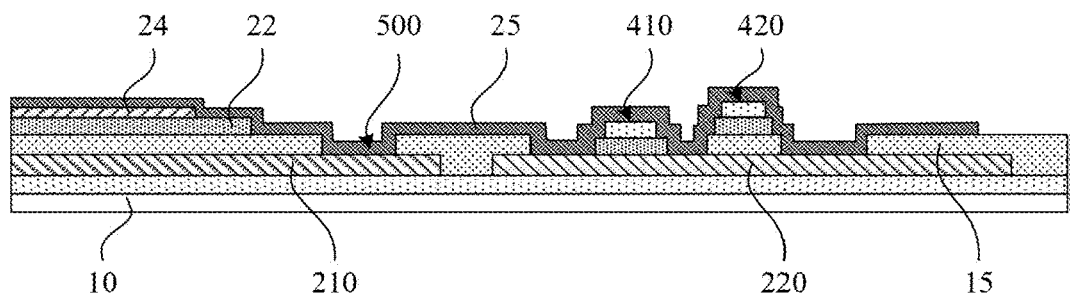
FIG. 4 is a cross-sectional view taken along the line A-A in FIG. 3.

FIG. 3 is a schematic diagram of a structure of a first fan-out area according to the present disclosure, which is an enlarged view of area C in FIG. 2; and FIG. 4 is a cross-sectional view taken along the line A-A in FIG. 3. As shown in FIG. 3, in the plane parallel to the display substrate, the binding region 200 is located at one side of the display region 100, and the first fan-out area of the binding region 200 is adjacent to the edge of the display region 110. The first fan-out area includes a first power line 210, a second power line 220 and a data fan-out line (not shown). The first power line 210 is connected with the high voltage power line of the display region 100 and configured to transmit high voltage signals to the plurality of display units of the display region 100. The second power line 220 is connected with the low voltage power line of the edge region 300 and configured to transmit low voltage signals to the plurality of display units of the display region 100. The first fan-out area further includes a first isolation dam 410, a second isolation dam 420 and an isolation groove 500, which are configured to block moisture from entering the display region 100. The first isolation dam 410 and the second isolation dam 420 are disposed in the binding region 200 and the edge region 300, forming an annular structure surrounding the display region 100 in the binding region 200 and the edge region 300. The first isolation dam 410 and the second isolation dam 420 are configured to block moisture entering the display region 100 from the periphery of the display region 100. In the binding region 200, the first isolation dam 410 and the second isolation dam 420 extend in a direction parallel to the edge of the display region 110. The distance between the first isolation dam 410 and the edge of the display region 110 is smaller than that between the second isolation dam 420 and the edge of the display region 110. In other words, the second isolation dam 420 is disposed at one side of the first isolation dam 410 away from the display region 100. The isolation groove 500 is disposed in the binding region 200 and is configured to block moisture entering the display region 100 along the edge of the first power line 210 and the edge of the second power line 220. The isolation groove 500 extends in a direction parallel to the edge of the display region 110, and the distance between the isolation groove 500 and the edge of the display region 110 is smaller than the distance between the first isolation dam 410 and the edge of the display region 110, that is, the isolation groove 500 is disposed between the edge of the display region 110 and the first isolation dam 410.

As shown in FIG. 4, in a plane perpendicular to the display substrate, the first fan-out area of the binding region 200 includes a composite insulating layer disposed on the substrate 10, a first power line 210 and a second power line 220 disposed on the composite insulating layer, a first flat layer 15, a first isolation dam 410 and a second isolation dam 420 disposed on the first power line 210 and the second power line 220, a pixel definition layer 22 disposed on the first flat layer 15, a cathode 24 disposed on the pixel definition layer 22, and a first encapsulation layer 25 covering the above structure. The first isolation dam 410 and the second isolation dam 420 are disposed on the second power line 220 and wrapped by the first encapsulation layer 25. The first isolation dam 410 is composed of a first dam foundation and a post spacer, and the second isolation dam 420 is composed of a flat dam foundation, a second dam foundation and a post spacer. The first flat layer 15 in the region adjacent to the first isolation dam 410 and the second isolation dam 420 is removed to expose the second power line 220, and the encapsulation layer 25 covers the exposed second power line 220 in this region. In order to block moisture intruding from the edge of the first power line 210 and the edge of the second power line 220, the first flat layer 15 on the first power line 210 is provided with an isolation groove 500. The first flat layer 15 in the isolation groove 500 is removed to expose the surface of the first power line 210, so that the encapsulation layer 25 covers the exposed surface of the first power line 210 in the isolation groove 500. The isolation groove 500 is disposed between the edge of the cathode 24 away from the display region and the first isolation dam 410 to avoid the first power line 210 exposed by the isolation groove 500 from contacting the cathode 24. In some embodiments, the position of the isolation groove 500 can be designed according to the size of the binding region, the line width of the first power line 210 and the line width of the second power line 220. On the premise of keeping the isolation groove 500 away from the cathode 24, the isolation groove 500 can be disposed on the first flat layer 15 and the pixel definition layer 22, which is not specifically limited in the present disclosure.

As shown in FIG. 2 and FIG. 3, the first power line 210 includes a first strip block 2101 and a second strip block 2102. The first strip block 2101 extends in a direction parallel to the edge of the display region 110, and the second strip block 2102 extends in a direction away from the display region 100. The second strip block 2102 is connected with the first strip block 2101 at one end adjacent to the display region 100 to form a T-shaped structure. The second power line 220 includes a third strip block 2201 and a fourth strip block 2202. The third strip block 2201 extends in a direction parallel to the edge of the display region 110, and the fourth strip block 2202 extends in a direction away from the display region 100. The fourth strip block 2202 is connected with the third strip block 2201 at one end adjacent to the display region 100 to form an angular structure. The second power line 220 is located at one side of the first strip block 2101 away from the display region 100 and at one side of the second strip block 2102 away from the data fan-out line. The first isolation dam 410 and the second isolation dam 420 are disposed on the second strip block 2102 of the first power line 210 and the third strip block 2201 of the second power line 220, and the isolation groove 500 is disposed on the first strip block 2101 of the first power line 210.

Figure 5:
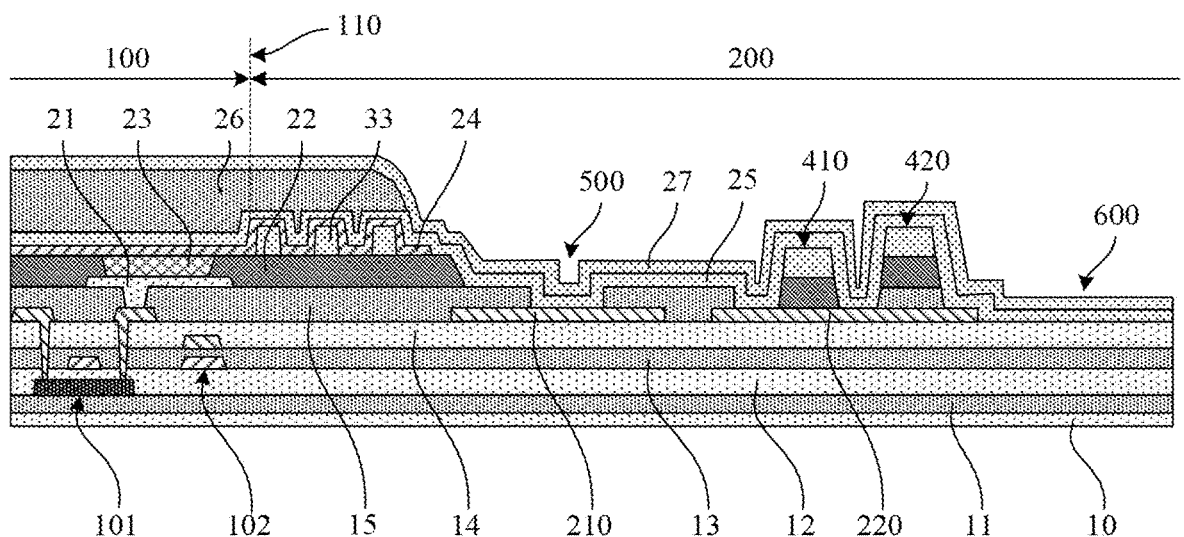
FIG. 5 is a schematic diagram of a structure of a display substrate according to the present disclosure.

FIG. 5 is a schematic diagram of a structure of a display substrate according to the present disclosure, which is a cross-sectional view taken along the line B-B in FIG. 3, illustrating the cross-sectional structure of the display region and the binding region in a single source/drain metal layer (1SD) structure. In a plane direction parallel to the display substrate, the display substrate includes a display region 100 and a binding region 200, and the binding region 200 is located at one side of the display region 100. In the plane direction perpendicular to the display substrate, the display region 100 includes a flexible substrate 10, a driving structure layer disposed on the flexible substrate 10, a light-emitting element disposed on the driving structure layer, and a composite encapsulation layer covering the light-emitting element. The binding region 200 includes a flexible substrate 10, a binding structure layer disposed on the flexible substrate 10, an isolation groove 500 and an isolation area 600 disposed on the binding structure layer. A first isolation dam 410, a second isolation dam 420, and an inorganic encapsulation layer covering the isolation groove 500, the first isolation dam 410, the second isolation dam 420 and the isolation area 600 are disposed in the isolation area 600.

In an exemplary embodiment, the driving structure layer of the display region 100 includes a plurality of transistors and storage capacitors forming a pixel driving circuit, which is illustrated by taking a first transistor 101 and a first storage capacitor 102 as an example in FIG. 5, wherein the first transistor 101 may be a driving transistor. The driving structure layer of the display region 100 includes a first insulating layer 11 disposed on the flexible substrate 10, an active layer disposed on the first insulating layer 11, a second insulating layer 12 covering the active layer, a first gate metal layer disposed on the second insulating layer 12, a third insulating layer 13 covering the first gate metal layer, a second gate metal layer disposed on the third insulating layer 13, a fourth insulating layer 14 covering the second gate metal layer, and a source/drain metal layer disposed on the fourth insulating layer 14. The active layer includes at least a first active layer, the first gate metal layer includes at least a first gate electrode and a first capacitor electrode, the second gate metal layer includes at least a second capacitor electrode, and the source/drain metal layer includes at least a first source electrode and a first drain electrode. The first active layer, the first gate electrode, the first source electrode and the first drain electrode constitute the first transistor 101. The first capacitor electrode and the second capacitor electrode constitute the first storage capacitor 102, and the source/drain metal layer is also referred to as the first source/drain metal layer metal layer (SD1). A first flat layer 15 is disposed on the driving structure layer of the display region 100. A light-emitting element is disposed on the first flat layer 15. The light-emitting element includes an anode 21, a pixel definition layer 22, an organic light-emitting layer 23 and a cathode 24. The anode 21 is connected with the first drain electrode of the first transistor 101 through a first via disposed on the first flat layer 15. The composite encapsulation layer includes a first encapsulation layer 25, a second encapsulation layer 26 and a third encapsulation layer 27 which are stacked, and the second encapsulation layer 26 of an organic material is disposed between the first encapsulation layer 25 and the third encapsulation layer 27 of an inorganic material.

The binding structure layer of the binding region 200 includes a composite insulating layer composed of a plurality of inorganic insulating layers, and a first power line 210 and a second power line 220 disposed on the composite insulating layer. The composite insulating layer includes a first insulating layer 11, a second insulating layer 12, a third insulating layer 13 and a fourth insulating layer 14 which are stacked on the flexible substrate 10, all of which are inorganic insulating layers. The first power line 210 and the second power line 220 are disposed on the fourth insulating layer 14, are disposed on the same layer as the first source electrode and the first drain electrode of the display region, and are formed by the same patterning process. The first flat layer 15 is disposed on the binding structure layer of the binding region 200. An isolation groove 500 and an isolation area 600 are disposed on the first flat layer 15. The isolation groove 500 is disposed in the area where the first power line 210 is located. The isolation groove 500 exposes the surface of the first power line 210. The isolation area 600 is disposed on one side of the second power line 220 away from the display region 100. A first isolation dam 410 and a second isolation dam 420 are disposed in the isolation area 600. The first isolation dam 410 and the second isolation dam 420 are disposed on the second power line 220. Except where the first isolation dam 410 and the second isolation dam 420 are located, the surfaces of the second power line 220 and the composite insulating layer are exposed at other positions of the isolation area 600. The inorganic encapsulation layer includes a first encapsulation layer 25 and a third encapsulation layer 27 which are stacked. The first encapsulation layer 25 and the third encapsulation layer 27 of an inorganic material cover the isolation groove 500 and the isolation area 600, and wrap the first isolation dam 410 and the second isolation dam 420. In addition, a pixel definition layer 22 is disposed on the first flat layer 15 adjacent to the display region 100, a plurality of post spacers 33 are disposed on the pixel definition layer 22 at intervals, and the cathode 24 wraps the plurality of post spacers 33.

In an exemplary embodiment, there may be one or more isolation grooves 500. The width of the isolation groove 500 is about 20 μm to about 50 μm. The distance between the isolation groove 500 and the edge of the display region 110 is smaller than that between the first isolation dam 410 and the edge of the display region 110, and the distance between the isolation groove 500 and the edge of the display region 110 is greater than that between the edge of the cathode 24 and the edge of the display region 110.

The structure of a display substrate according to the present disclosure is described below by an example of a preparation process of the display substrate. The "patterning process" mentioned in the present disclosure includes processes, such as film layer deposition, photoresist coating, mask exposure, development, etching, and photoresist stripping. Deposition may be implemented by any one or more of sputtering, evaporation and chemical vapor deposition, coating may be implemented by any one or more of spraying and spin coating, and etching may be implemented by any one or more of dry etching and wet etching. "Film" refers to a layer of film fabricated by a certain material on a base substrate by using deposition or coating process. If the "film" does not need a patterning process during the whole preparing process, the "film" can also be called a "layer". If the "film" needs a patterning process during the whole preparing process, it is called "film" before the patterning process and "layer" after the patterning process. The "layer" after the patterning process contains at least one "pattern". In the present disclosure, "A and B are disposed on the same layer" means that A and B are formed at the same time by the same patterning process. "An orthographic projection of A includes an orthographic projection of B" means that the orthographic projection of B falls within a range of the orthographic projection of A, or the orthographic projection of A covers the orthographic projection of B.

Figure 6:
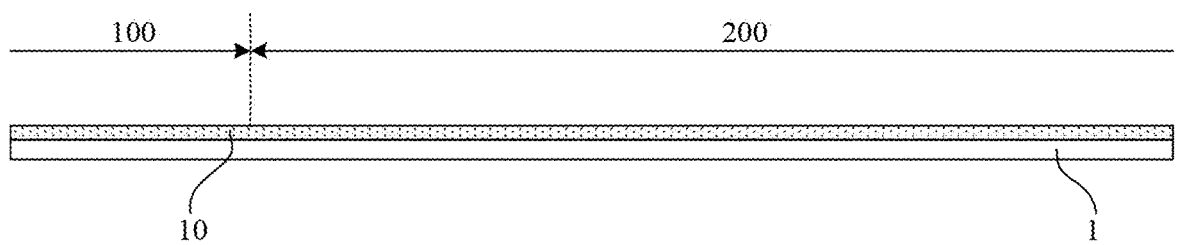
FIG. 6 is a schematic diagram of a structure of a display substrate after a pattern of a flexible substrate is formed according to the present disclosure.

Step (1) includes: preparing a flexible substrate 10 on a glass carrier plate 1. In the present disclosure, the flexible substrate 10 includes a first flexible material layer, a first inorganic material layer, a semiconductor layer, a second flexible material layer and a second inorganic material layer which are stacked on the glass carrier plate 1. The materials of the first and second flexible material layers can be polyimide (PI), polyethylene terephthalate (PET) or surface-treated polymer soft film, etc. The materials of the first and second inorganic material layers can be silicon nitride (SiNx) or silicon oxide (SiOx) to improve the moisture and oxygen resistance of the substrate. The first and second inorganic material layers are also called barrier layers. The material of the semiconductor layer can be amorphous silicon (a-si). In an exemplary embodiment, taking the laminated structure PI1/Barrier1/a-si/PI2/Barrier2 as an example, the preparation process may include: coating a layer of polyimide on the glass carrier plate 1, and forming a first flexible (PI1) layer after curing to form a film; subsequently, depositing a layer of barrier film on the first flexible layer to form a first barrier (Barrier 1) layer covering the first flexible layer; then depositing a layer of amorphous silicon film on the first barrier layer to form an amorphous silicon (a-si) layer covering the first barrier layer; then coating a layer of polyimide on the amorphous silicon layer, and forming a second flexible (PI2) layer after curing to form a film; then depositing a layer of barrier film on the second flexible layer to form a second barrier (Barrier 2) layer covering the second flexible layer, to complete the preparation of the flexible substrate 10, as shown in FIG. 6. After this process, both the display region 100 and the binding region 200 include the flexible substrate 10.

Step (2) includes: preparing patterns of a driving structure layer and a binding structure layer on the flexible substrate 10. The driving structure layer of the display region 100 includes a first transistor 101 and a first storage capacitor 102 constituting a pixel driving circuit, and the binding structure layer of the binding region 200 includes a first power line 210 and a second power line 220. In an exemplary embodiment, the preparation process of the driving structure layer may include that:

A first insulating film and an active layer film are sequentially deposited on the flexible substrate 10, the active layer film is patterned by a patterning process to form a first insulating layer 11 covering the whole flexible substrate 10 and an active layer pattern disposed on the first insulating layer 11, wherein the active layer pattern includes at least the first active layer. After this patterning process, the binding region 200 includes the first insulating layer 11 disposed on the flexible substrate 10.

Then, a second insulating film and a first metal film are sequentially deposited, and the first metal film is patterned by a patterning process to form a second insulating layer 12 covering the active layer pattern and a first gate metal layer pattern disposed on the second insulating layer 12, wherein the first gate metal layer pattern includes at least a first gate electrode and a first capacitor electrode. After this patterning process, the binding region 200 includes the first insulating layer 11 and the second insulating layer 12 stacked on the flexible substrate 10.

Then, a third insulating film and a second metal film are sequentially deposited, and the second metal film is patterned by a patterning process to form a third insulating layer 13 covering the first gate metal layer and a second gate metal layer pattern disposed on the third insulating layer 13, wherein the second gate metal layer pattern includes at least a second capacitor electrode, and the position of the second capacitor electrode corresponds to that of the first capacitor electrode. After this patterning process, the binding region 200 includes the first insulating layer 11, the second insulating layer 12 and the third insulating layer 13 stacked on the flexible substrate 10.

Then, a fourth insulating film is deposited and patterned by a patterning process to form a pattern of a fourth insulating layer 14 covering the second gate metal layer. The fourth insulating layer 14 is provided with at least two first vias. The fourth insulating layer 14 in the two first vias, the third insulating layer 13 and the second insulating layer 12 are etched away to expose the surface of the first active layer. After this patterning process, the binding region 200 includes the first insulating layer 11, the second insulating layer 12, the third insulating layer 13 and the fourth insulating layer 14 stacked on the flexible substrate 10.

Then, a third metal film is deposited and patterned by a patterning process. A source/drain metal layer pattern is formed on the fourth insulating layer 14, wherein the source/drain metal layer includes at least a first source electrode and a first drain electrode located in the display region 100, and a first power line 210 and a second power line 220 located in the binding region 200. The first source electrode and the first drain electrode are respectively connected with the first active layer through a first via.

Figure 7:
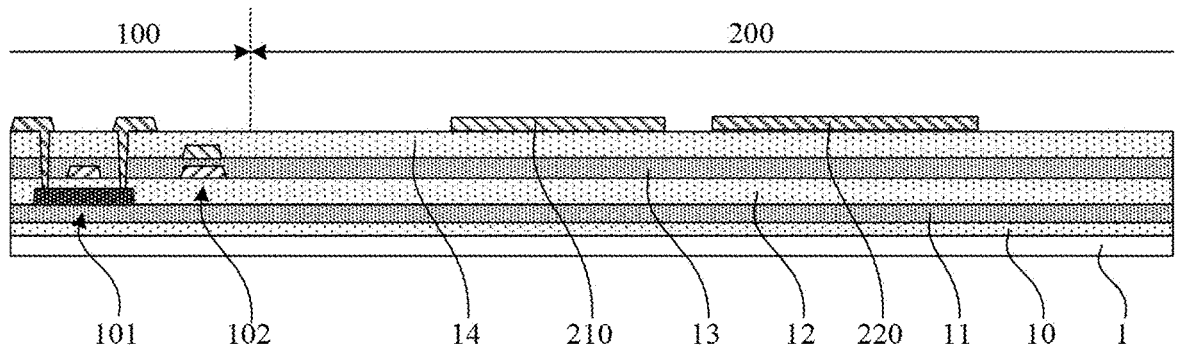
FIG. 7 is a schematic diagram of a structure of a display substrate after patterns of a driving structure layer and a binding structure layer are formed according to the present disclosure.

To this point, the patterns of a driving structure layer of the display region 100 and a binding structure layer of the binding region 200 are prepared and completed on the flexible substrate 10, as shown in FIG. 7. In the driving structure layer of the display region 100, the first active layer, the first gate electrode, the first source electrode and the first drain electrode constitute a first transistor 101, and the first capacitor electrode and the second capacitor electrode constitute a first storage capacitor 102. The binding structure layer of the binding region 200 includes a composite insulating layer disposed on the flexible substrate 10, and a first power line 210 and a second power line 220 disposed on the composite insulating layer. The composite insulating layer includes a first insulating layer 11, a second insulating layer 12, a third insulating layer 13 and a fourth insulating layer 14 which are stacked. In an exemplary embodiment, the distance between the first power line 210 and the second power line 220 is about 50 μm to about 100 μm.

In an exemplary embodiment, the first insulating layer, the second insulating layer, the third insulating layer and the fourth insulating layer can adopt any one or more of silicon oxide (SiOx), silicon nitride (SiNx) and silicon oxynitride (SiON), and can be a single layer, multiple layers or a composite layer. The first insulating layer is called buffer layer to improve the moisture and oxygen resistance of the substrate, the second and third insulating layers are called gate insulating (GI) layer, and the fourth insulating layer is called interlayer insulating (ILD) layer. The first metal film, the second metal film and the third metal film may adopt metal materials, such as any one or more of silver (Ag), copper (Cu), aluminum (Al), titanium (Ti) and molybdenum (Mo), or alloy materials of the above metals, such as AlNd alloy or MoNb alloy, which may be a single-layer structure or a multilayer composite structure, such as Ti/Al/Ti, etc. The active layer film may adopt various materials such as amorphous indium gallium zinc oxide material (a-IGZO), zinc oxynitride (ZnON), indium zinc tin oxide (IZTO), amorphous silicon (a-Si), polysilicon (p-Si), hexathiophene, polythiophene, or the like, that is, the present disclosure is applicable to transistors prepared based on oxide technology, silicon technology and organic technology.

Figure 8:
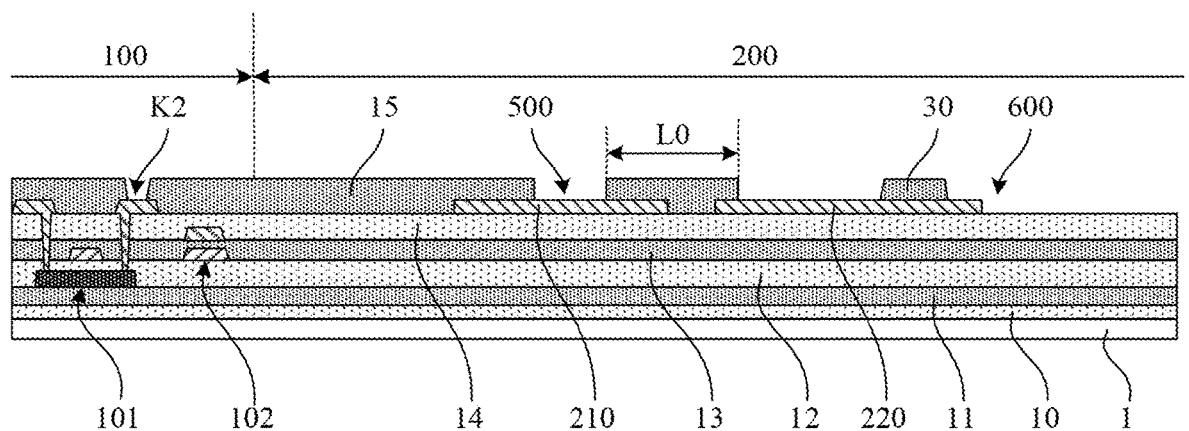
FIG. 8 is a schematic diagram of a structure of a display substrate after a pattern of an isolation groove is formed according to the present disclosure.

Step (3) includes: coating a flat film of an organic material on the flexible substrate with the above pattern formed thereon to form a first flat (PLN) layer 15 covering the whole flexible substrate 10, and forming patterns of a second via K2, an isolation groove 500, an isolation area 600 and a flat dam foundation 30 on the first flat layer 15 through mask, exposure and development processes. The first flat layer 15 serves as an organic insulating layer of the present disclosure. The second via K2 is formed in the display region 100, and the first flat layer 15 in the second via is developed away to expose the surface of the first drain electrode of the first transistor 101. The isolation groove 500 is formed at the position of the first power line 210 in the binding region 200, and the first flat layer 15 in the isolation groove 500 is developed away to expose the surface of the first power line 210. The isolation area 600 is formed on one side of the second power line 220 away from the display region 100 in the binding region 200. A flat dam foundation 30 is disposed on the second power line 220 in the isolation area 600. Except for the flat dam foundation 30, the first flat layer 15 in other positions of the isolation area 600 is developed away to expose the surface of the second power line 220 and the surface of the fourth insulating layer 14, as shown in FIG. 8. In an exemplary embodiment, the isolation groove 500 of the binding region 200 is used to prevent moisture from entering the display region 100 along the edge of the first power line 210 and the edge of the second power line 220, the isolation area 600 is used to form two isolation dams on the second power line 220, and the flat dam foundation 30 is the dam foundation of the second isolation dam. In some embodiments, the width of the isolation groove 500 is about 20 μm to about 50 μm, and there may be one, or two, or more than three isolation grooves. The width of the flat dam foundation 30 is about 20 μm to about 60 μm.

In some embodiments, the distance L0 between the edge of the isolation groove 500 adjacent to the isolation area 600 and the edge of the isolation area 600 adjacent to the isolation groove 500 is about 40 μm to about 100 μm, so as to reduce the risk of the first flat layer 15 falling off in the area between the isolation groove 500 and the isolation area 600. In an exemplary embodiment, in the direction parallel to the edge of the display region, the length of the isolation groove 500 is equal to the length of the first power line 210 at the position where the isolation groove 500 is located, that is, the length of the orthographic projection of the isolation groove 500 on the flexible substrate 10 is equal to the length of the orthographic projection of the first power line 210 on the flexible substrate 10, and the surface of the first power line 210 is exposed in the isolation groove 500. In some embodiments, in the direction parallel to the edge of the display region, the length of the isolation groove 500 may be longer than that of the first power line 210 at the position where the isolation groove 500 is located. The length of the orthographic projection of the isolation groove 500 on the flexible substrate 10 includes the length of the orthographic projection of the first power line 210 on the flexible substrate 10. In the area where the first power line 210 is located, the surface of the first power line 210 is exposed in the isolation groove 500, and in the area outside the first power line 210, the surface of the composite insulating layer is exposed in the isolation groove 500. For the isolation groove 500 in which the surface of the composite insulating layer is exposed, it may be continuous or may be disposed at intervals.

After this patterning process, the binding region 200 includes a composite insulating layer disposed on the flexible substrate 10, a first power line 210 and a second power line 220 disposed on the composite insulating layer, and a first flat layer 15 disposed on the first power line 210 and the second power line 220. An isolation groove 500 and an isolation area 600 are formed on the first flat layer 15, and a flat dam foundation 30 is formed in the isolation area 600. In the present disclosure, "length" refers to the feature size along the direction of the edge of the display region, and "width" refers to the feature size along the direction away from the display region.

Figure 9:
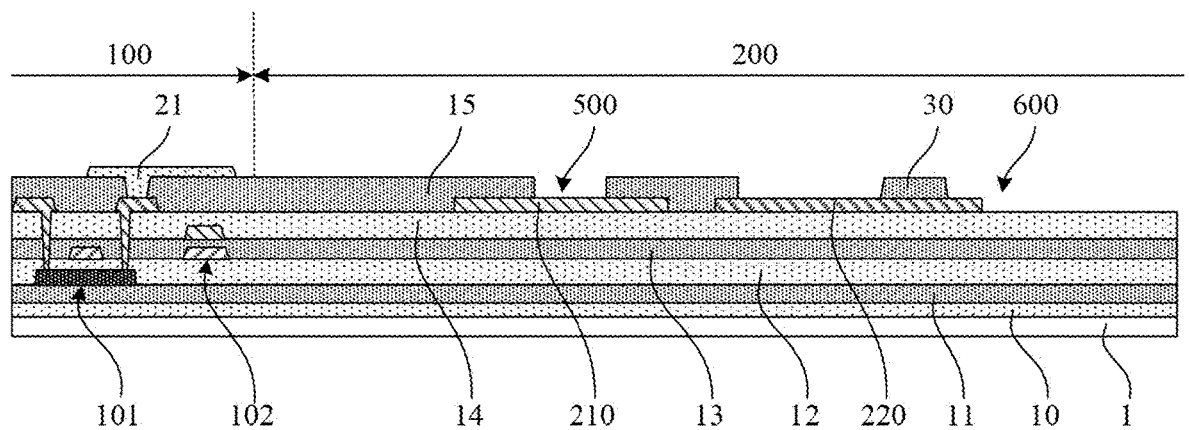
FIG. 9 is a schematic diagram of a structure of a display substrate after a pattern of an anode is formed according to the present disclosure.

Step (4) includes: depositing a transparent conductive film on the flexible substrate with the above patterns formed thereon, and patterning the transparent conductive film by a patterning process to form a pattern of an anode 21. The anode 21 is formed on the first flat layer 15 of the display region 100 and connected with the first drain electrode of the first transistor 101 through the second via K2, as shown in FIG. 9.

After this patterning process, the film-layer structure of the bonding region 200 has not changed. In an exemplary embodiment, the transparent conductive film may be made of indium tin oxide (ITO) or indium zinc oxide (IZO).

Figure 10:
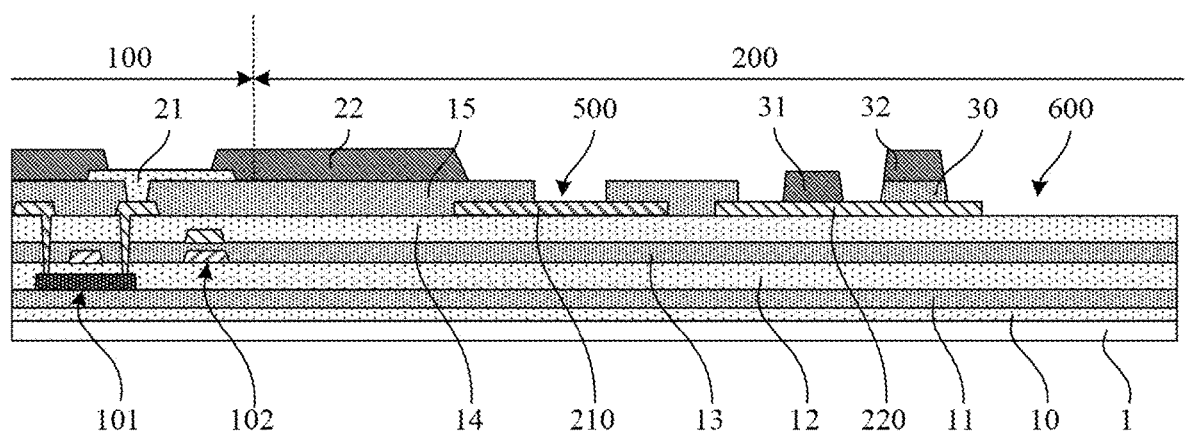
FIG. 10 is a schematic diagram of a structure of a display substrate after a pattern of a pixel definition layer is formed according to the present disclosure.

Step (5) includes: coating a pixel definition film on the substrate with the above patterns formed thereon, and forming patterns of a pixel definition layer (PDL) 22, a first dam foundation 31 and a second dam foundation 32 through mask, exposure and development processes. The pixel definition layer 22 is formed in the display region 100 and a part of the binding region 200 adjacent to the display region 100, a pixel opening is disposed on the pixel definition layer 22 of the display region 100, and the pixel definition layer 22 in the pixel opening is developed away to expose the surface of the anode 21. The first dam foundation 31 and the second dam foundation 32 are formed in the isolation area 600 of the binding region 200. The first dam foundation 31 is formed on the second power line 220 in the isolation area 600, and the second dam foundation 32 is formed on the flat dam foundation 30. The distance between the first dam foundation 31 and the display region 100 is smaller than that between the second dam foundation 32 and the display region 100, as shown in FIG. 10. In the present disclosure, the first dam foundation 31 is used to form a first isolation dam, and the flat dam foundation 30 and the second dam foundation 32 are used to form a second isolation dam. In an exemplary embodiment, polyimide, acrylic or polyethylene terephthalate or the like may be used for the pixel definition layer.

Figure 11:
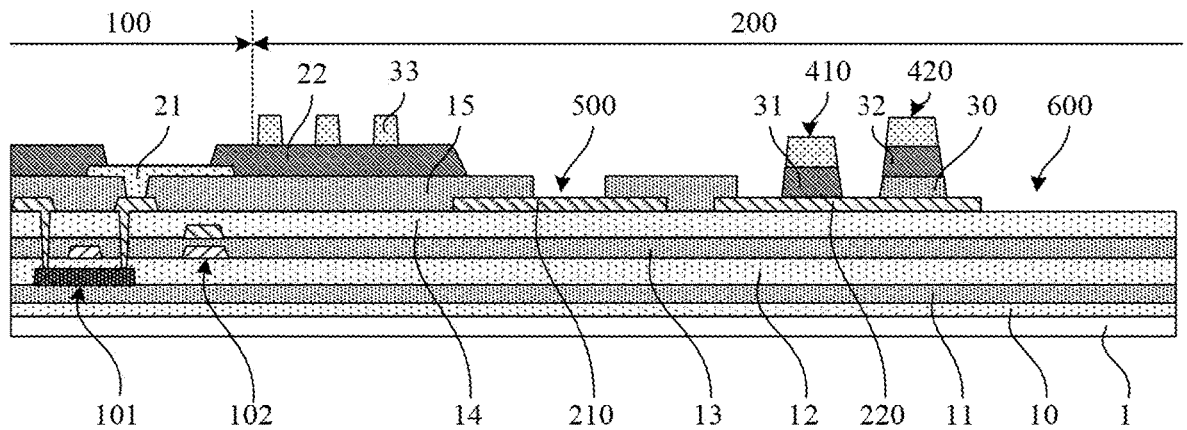
FIG. 11 is a schematic diagram of a structure of a display substrate after a pattern of a post spacer is formed according to the present disclosure.

Step (6) includes: coating a film of an organic material on the flexible substrate with the above patterns formed thereon, and forming patterns of a plurality of post spacers (PS) 33 through mask, exposure and development processes. The plurality of post spacers 33 are respectively formed on the pixel definition layer 22, the first dam foundation 31 and the second dam foundation 32 of the binding region 200, as shown in FIG. 11. In an exemplary embodiment, in the direction perpendicular to the flexible substrate 10, the cross-sectional shapes of the flat dam foundation 30, the first dam foundation 31, the second dam foundation 32 and the post spacers 33 are trapezoidal. The first dam foundation 31 and the post spacer 33 thereon constitute a first support dam 410. The flat dam foundation 30, the second dam foundation 32 and the post spacer 33 thereon constitute a second support dam 420. The distance between the upper end face of the first support dam 410 and the flexible substrate 10 is smaller than that between the upper end face of the second support dam 420 and the flexible substrate 10, and the distance between the first support dam 410 and the display region 100 is smaller than that between the second support dam 420 and the display region 100. In an exemplary embodiment, the width of the orthographic projection of the first support dam 410 and the second support dam 420 on the flexible substrate 10 is about 20 μm to about 60 μm, and the distance between the first support dam 410 and the second support dam 420 is about 20 μm to about 60 μm. In some embodiments, the width of the orthographic projection of the first support dam 410 and the second support dam 420 on the flexible substrate 10 is about 40 μm, and the distance between the first support dam 410 and the second support dam 420 is about 40 μm.

Figure 12:
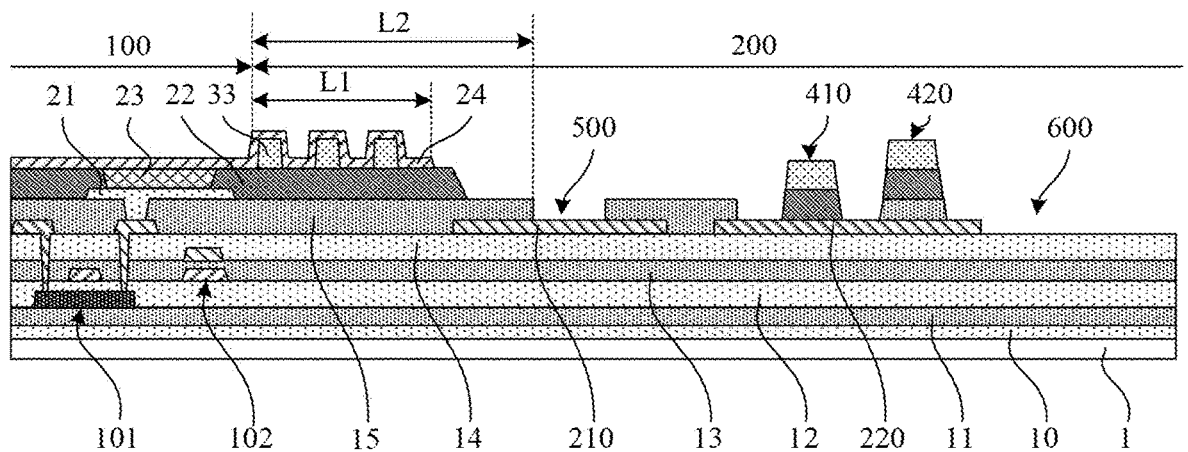
FIG. 12 is a schematic diagram of a structure of a display substrate after patterns of an organic light-emitting layer and a cathode are formed according to the present disclosure.

Step (7) includes: sequentially forming an organic light-emitting layer 23 and a cathode 24 on the flexible substrate with the above patterns formed thereon, as shown in FIG. 12. The organic light-emitting layer 23 includes a hole injection layer, a hole transport layer, a light-emitting layer, an electron transport layer and an electron injection layer which are stacked, and they are formed in the pixel opening of the display region 100 to realize the connection between the organic light-emitting layer 23 and the anode 21. The cathode 24 is formed on the pixel definition layer 22, is connected with the organic light-emitting layer 23, and wraps a plurality of post spacers 33 on the pixel definition layer 22. In this patterning process, since the first power line 210 is exposed at the isolation groove 500, the width L1 of the cathode 24 in the binding region 200 (the distance between the edge of the cathode 24 and the edge of the display region) is smaller than the distance L2 between the isolation groove 500 and the display region 100, so as to avoid the first power line 210 in the isolation groove 500 overlapping with the cathode 24. In some embodiments, the distance (L2-L1) between the edge of the cathode 24 and the isolation groove 500 can be set to about 50 μm to about 150 μm, which can be realized by setting the distance between the edge of the cathode opening and the isolation groove to be larger than the distance between the cathode shadow with an Open Mask (OPM). In an exemplary embodiment, the cathode may use any one or more of magnesium (Mg), silver (Ag), aluminum (Al), copper (Cu) and lithium (Li), or an alloy made of any one or more of the above metals.

Figure 13:
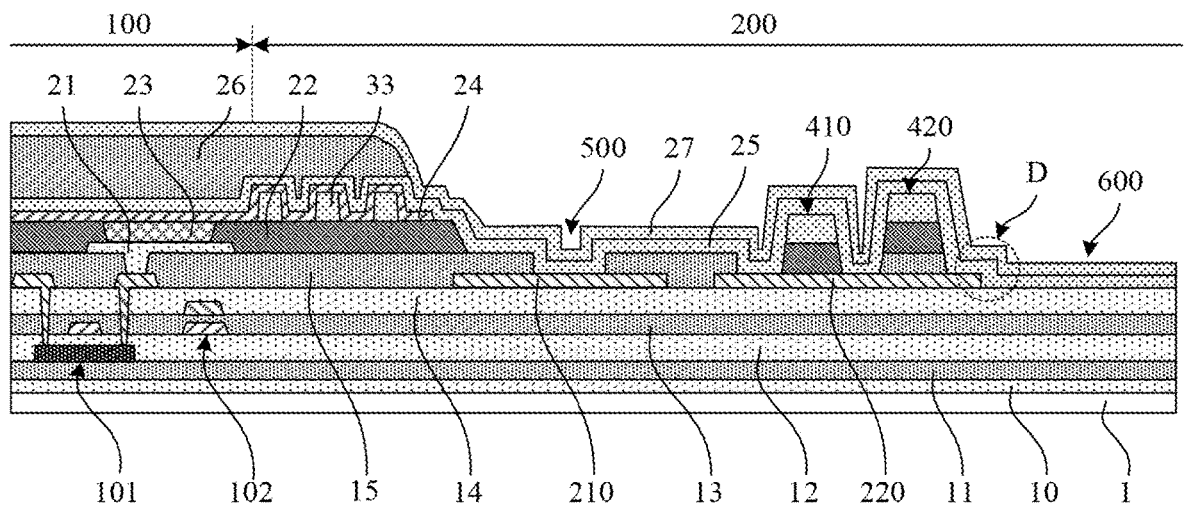
FIG. 13 is a schematic diagram of a structure of a display substrate after a pattern of an encapsulation layer is formed according to the present disclosure.

Step (8) includes: forming an encapsulation layer on the basis of forming the above patterns. The encapsulation layer includes a first encapsulation layer 25, a second encapsulation layer 26 and a third encapsulation layer 27 which are stacked, as shown in FIG. 13. The first encapsulation layer 25 is made of an inorganic material, covers the cathode 24 in the display region 100, and in the binding region 200, it wraps the plurality of post spacers 33, covers the isolation groove 500, covers the isolation area 600, and wraps the first support dam 410 and the second support dam 420 in the isolation area 600, respectively. The second encapsulation layer 26 is made of an organic material, and is disposed in the display region 100 and the area of the binding region 200 where the post spacer 33 is located. The third encapsulation layer 27 is made of an inorganic material and covers the first encapsulation layer 25 and the second encapsulation layer 26. In the present disclosure, since the isolation groove 500 is formed with a surface exposing the first power line 210, the first encapsulation layer 25 and the third encapsulation layer 27 of an inorganic material directly cover the first power line 210, and an isolation structure of an inorganic material is formed in the first flat layer 15 of an organic material, which blocks the propagation path of moisture along the organic material layer. Since the isolation area 600 is formed with a surface exposing the second power line 220 and the fourth insulating layer 14, the first encapsulation layer 25 and the third encapsulation layer 27 of an inorganic material directly cover the second power line 220 and the fourth insulating layer 14, which can ensure that external moisture cannot enter the display region 100, and improve the encapsulation effect and process quality.

Figure 14:
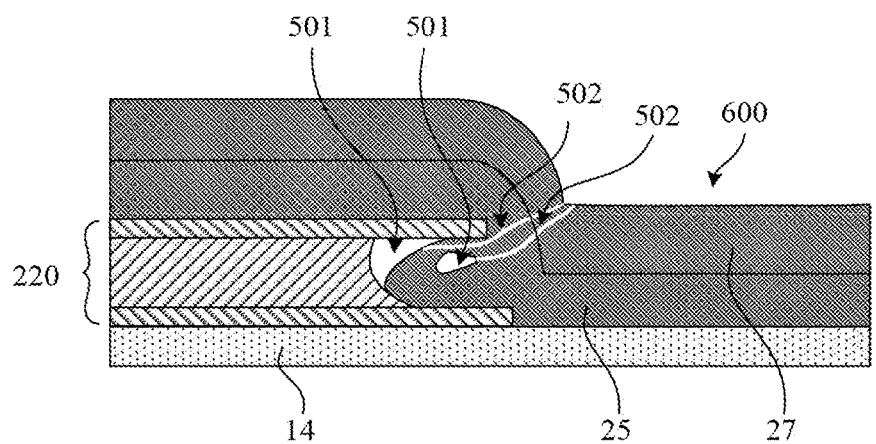
FIG. 14 is a schematic structural diagram of an edge of a binding region according to the present disclosure.

FIG. 14 is a schematic structural diagram of an edge of a binding region according to the present disclosure, which is an enlarged view of the area D in FIG. 13. As shown in FIG. 14, in order to form the first isolation dam and the second isolation dam in the binding region 200, in the process of forming the first flat layer, the first flat layer is removed from the area where the first isolation dam and the second isolation dam are located and its adjacent areas (isolation area 600), so that the edges of the first power line 210 and the second power line 220 in this area are exposed after the process of forming the first flat layer. For the first power line 210 and the second power line 220 with Ti/Al/Ti multilayer composite structure, the edges of the first power line 210 and the second power line 220 will be eroded by the anodic etching solution in the subsequent anode etching process. Because the etching rate of Al by the etching solution is greater than the rate of etching Ti, side pits will be formed on the edges of the eroded first power line 210 and second power line 220, and the Ti layer above the Al layer protrudes from the Al layer for a certain distance, forming an "eave" structure. In the subsequent process of forming the first encapsulation layer 25 and the third encapsulation layer 27 by chemical vapor deposition (CVD), the "eave" structure shields the vapor deposited particles, so that the side pits cannot be filled with encapsulation materials, thereby forming voids 501. In this way, when cracks 502 appear in the first encapsulation layer 25 and the third encapsulation layer 27, external moisture can enter the void 501 through the cracks 502, causing the moisture to circulate at the edges of the first power line 210 and the second power line 220. The voids 501 at the edges of the first power line 210 and the second power line 220 only exist in the areas where the first and second isolation dams are located and the adjacent areas thereof, and no such voids will be formed at the edges of the first power line 210 and the second power line 220 in other areas because they are covered by the first flat layer. However, since the first flat layer of an organic material itself conducts moisture, moisture can be transmitted through the first flat layer instead of the voids 501 until it spreads to the display region, causing dark spots and defects in the display region due to erosion of moisture and oxygen.

For a display substrate with a single source/drain metal layer (1SD) structure, the moisture intrusion path appearing at the edge of the power line passing through the isolation dam is blocked by disposing an isolation groove on the first flat layer in the present disclosure. After the moisture flows to the first flat layer along the edge of the power line, it will conduct and diffuse to the display region in the first flat layer. Due to the disposition of an isolation groove on the first flat layer, moisture is blocked by the isolation groove, and it needs to bypass the isolation groove before entering the display region, thus the invasion path is greatly prolonged, thereby reducing the risk of GDS, avoiding display defects of the display substrate and improving the display quality. The preparation process of the present disclosure can be realized by using the existing mature preparation equipment, which has little improvement on the existing process, and can be well compatible with the existing preparation process. This process can be readily realized, is easy to implement, and has high production efficiency, low production cost and high yield rate. Because the structure and process route of power line passing through the isolation dam are common, and the possibility of moisture intrusion path appearing at the edge of the power line is very high, the solution of the present disclosure has a wide application prospect.

As shown in FIG. 3 to FIG. 14, the display substrate provided by the present disclosure includes:
a flexible substrate 10;
a first insulating layer 11 disposed on the flexible substrate 10;
a first active layer disposed on the first insulating layer 11;
a second insulating layer 12 covering the first active layer;
a first gate metal layer disposed on the second insulating layer 12, wherein the first gate metal layer is disposed in the display region 100 and includes at least a first gate electrode and a first capacitor electrode;
a third insulating layer 13 covering the first gate metal layer;
a second gate metal layer disposed on the third insulating layer 13, wherein the second gate metal layer is disposed in the display region 100 and includes at least a second capacitor electrode;
a fourth insulating layer 14 covering the second gate metal layer, wherein the fourth insulating layer 14 of the display region 100 is provided with a first via exposing the first active layer;

a source/drain metal layer disposed on the fourth insulating layer 14, wherein the source/drain metal layer includes at least a first source electrode and a first drain electrode of the display region 100 and a first power line 210 and a second power line 220 of the binding region 200, and the first source electrode and the first drain electrode are respectively connected with the first active layer through a first via;

a first flat layer 15 covering the aforementioned structure, wherein in the display region 100, a second via K2 exposing the first drain electrode is disposed on the first flat layer 15; in the binding region 200, an isolation groove 500 and an isolation area 600 are disposed on the first flat layer 15, the isolation groove 500 exposes the surface of the first power line 210, a flat dam foundation 30 is disposed on the second power line 220 in the isolation area 600, and the second power line 220 and the fourth insulating layer 14 are exposed in the area outside the flat dam foundation 30;

an anode 21 formed in the display region 100, wherein the anode 21 is connected with the first drain electrode through the second via;

a pixel definition layer 22, a first dam foundation 31 and a second dam foundation 32, wherein a pixel opening is disposed on the pixel definition layer 22 to expose the anode 21, the first dam foundation 31 is disposed on the second power line 220 in the isolation area 600, and the second dam foundation 32 is disposed on the flat dam foundation 30;

a plurality of post spacers 33 disposed on the pixel definition layer 22, the first dam foundation 31 and the second dam foundation 32;

an organic light-emitting layer 23 connected with the anode 21;

a cathode 24 connected with the organic light-emitting layer 23, wherein the distance between the edge of the cathode and the display region 100 in the binding region 200 is smaller than the distance between the isolation groove 500 and the display region 100; and an encapsulation layer covering the above structure.

The structure and preparation process of the display substrate of the present disclosure are merely illustrative. In exemplary embodiments, corresponding structures may be changed and patterning processes may be added or reduced according to actual needs. For example, in a plane parallel to the display substrate, the isolation groove may be in a shape of a curved line or a polygonal line. For another example, in the plane perpendicular to the display substrate, the sectional shape of the isolation groove may be rectangular or trapezoidal, which is not specifically limited in the present disclosure.

Figure 15:
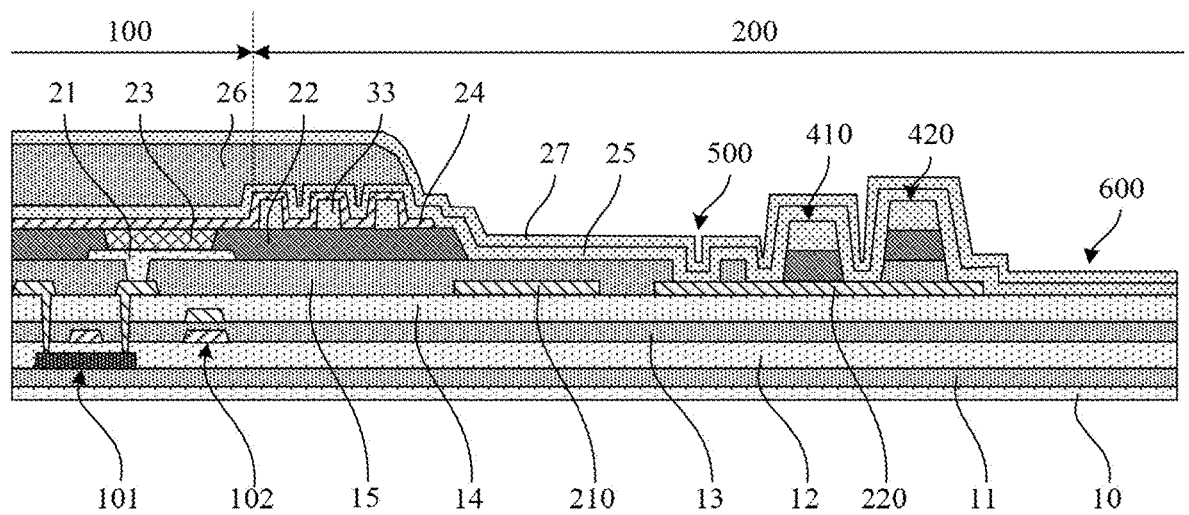
FIG. 15 is a schematic diagram of another structure of a display substrate according to the present disclosure.

FIG. 15 is a schematic diagram of another structure of a display substrate according to the present disclosure, which is a cross-sectional view taken along the line B-B in FIG. 3. As shown in FIG. 15, the display substrate includes a display region 100 and a binding region 200. The binding region 200 is located at one side of the display region 100. The display region 100 includes a flexible substrate 10, a driving structure layer disposed on the flexible substrate 10, a light-emitting element disposed on the driving structure layer, and a composite encapsulation layer covering the light-emitting element. The binding region 200 includes a flexible substrate 10, a binding structure layer disposed on the flexible substrate 10, an isolation groove 500 and an isolation area 600 disposed on the binding structure layer. The isolation area 600 is provided with a first isolation dam 410, a second isolation dam 420, and an inorganic encapsulation layer covering the isolation groove 500, the first isolation dam 410, the second isolation dam 420 and the isolation area 600. In an exemplary embodiment, the structure of the binding structure layer of the display region 100 and the binding region 200 is similar to the corresponding structure described in the previous embodiments. The first flat layer 15 is disposed on the binding structure layer of the binding region 200. An isolation groove 500 and an isolation area 600 are disposed on the first flat layer 15. The isolation groove 500 is disposed in the area where the second power line 220 is located. The isolation groove 500 exposes the surface of the second power line 220. A first isolation dam 410 and a second isolation dam 420 are disposed on the second power line 220 of the isolation area 600, and the surfaces of the second power line 220 and the composite insulating layer are exposed in the area outside the first isolation dam 410 and the second isolation dam 420. The inorganic encapsulation layer includes a first encapsulation layer 25 and a third encapsulation layer 27 which are stacked. The first encapsulation layer 25 and the third encapsulation layer 27 of an inorganic material cover the isolation groove 500 and the isolation area 600, and wrap the first isolation dam 410 and the second isolation dam 420. In some embodiments, the distance between the edge of the isolation groove 500 adjacent to the first isolation dam 410 and the edge of the first isolation dam 410 adjacent to the isolation groove 500 is about 40 μm to about 60 μm.

Figure 16:
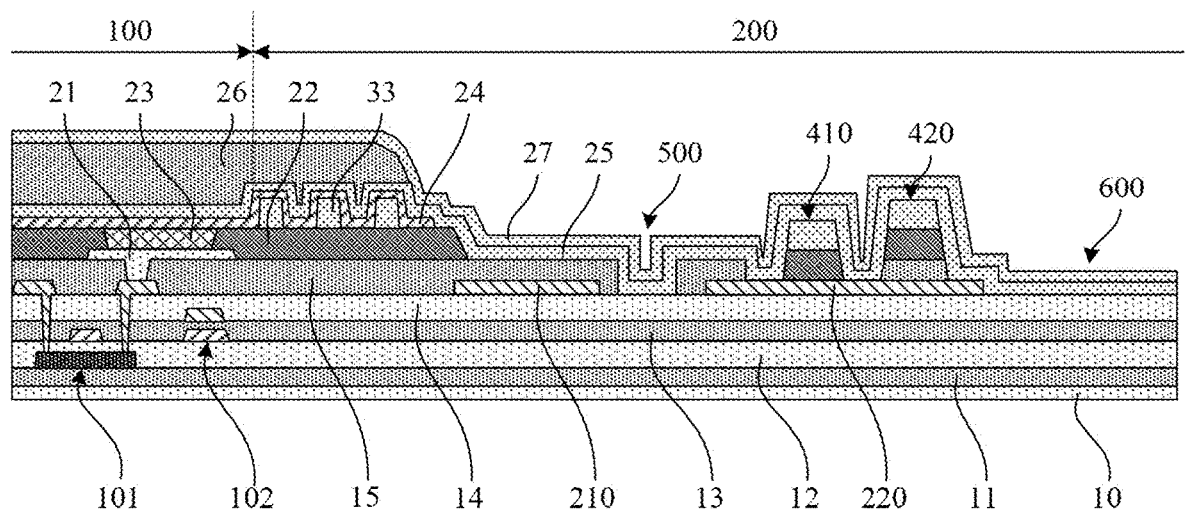
FIG. 16 is a schematic diagram of another structure of a display substrate according to the present disclosure.

FIG. 16 is a schematic diagram of another structure of a display substrate according to the present disclosure, which is a cross-sectional view taken along the line B-B in FIG. 3. As shown in FIG. 16, the display substrate includes a display region 100 and a binding region 200. The binding region 200 is located at one side of the display region 100. The display region 100 includes a flexible substrate 10, a driving structure layer disposed on the flexible substrate 10, a light-emitting element disposed on the driving structure layer, and a composite encapsulation layer covering the light-emitting element. The binding region 200 includes a flexible substrate 10, a binding structure layer disposed on the flexible substrate 10, an isolation groove 500 and an isolation area 600 disposed on the binding structure layer. The isolation area 600 is provided with a first isolation dam 410, a second isolation dam 420, and an inorganic encapsulation layer covering the isolation groove 500, the first isolation dam 410, the second isolation dam 420 and the isolation area 600. In an exemplary embodiment, the structure of the binding structure layer of the display region 100 and the binding region 200 is similar to the corresponding structure described in the previous embodiments. The first flat layer 15 is disposed on the binding structure layer of the binding region 200. An isolation groove 500 and an isolation area 600 are disposed on the first flat layer 15. The isolation groove 500 is disposed in the area between the first power line 210 and the second power line 220, and the isolation groove 500 exposes the surface of the fourth insulating layer 14 in the area between the first power line 210 and the second power line 220. A first isolation dam 410 and a second isolation dam 420 are disposed on the second power line 220 of the isolation area 600, and the surfaces of the second power line 220 and the composite insulating layer are exposed in the area outside the first isolation dam 410 and the second isolation dam 420. The inorganic encapsulation layer includes a first encapsulation layer 25 and a third encapsulation layer 27 which are stacked. The first encapsulation layer 25 and the third encapsulation layer 27 of an inorganic material cover the isolation groove 500 and the isolation area 600, and wrap the first isolation dam 410 and the second isolation dam 420. In some embodiments, the distance between the edge of the isolation groove 500 adjacent to the first isolation dam 410 and the edge of the first isolation dam 410 adjacent to the isolation groove 500 is about 40 μm to about 60 μm.

Figure 17:
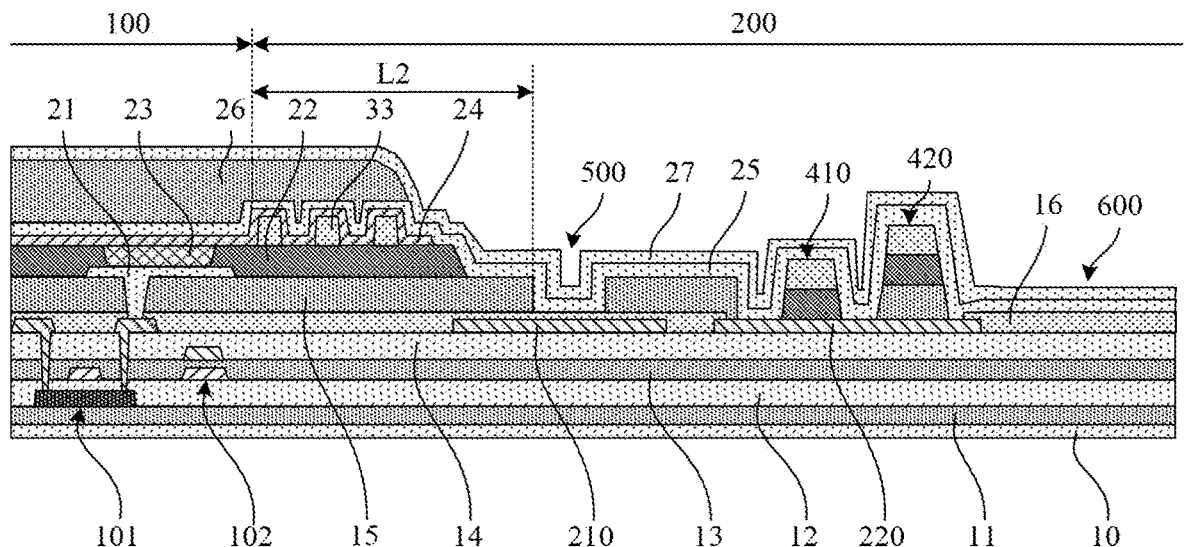
FIG. 17 is a schematic diagram of another structure of a display substrate according to the present disclosure.

FIG. 17 is a schematic diagram of another structure of a display substrate according to the present disclosure, which is a cross-sectional view taken along the line B-B in FIG. 3. The structures of the light-emitting element and the composite encapsulation layer in the display region 100, and the isolation groove, the isolation area, the first isolation dam and the second isolation dam in the binding region 200 are similar to the corresponding structures described in the previous embodiments, but different from them in that the display substrate further includes a fifth insulating layer 16. As shown in FIG. 17, the driving structure layer of the display region 100 includes: a first insulating layer 11 disposed on the flexible substrate 10, an active layer disposed on the first insulating layer 11, a second insulating layer 12 covering the first active layer, a first gate metal layer disposed on the second insulating layer 12, a third insulating layer 13 covering the first gate metal layer, a second gate metal layer disposed on the third insulating layer 13, a fourth insulating layer 14 covering the second gate metal layer, a source/drain metal layer disposed on the fourth insulating layer 14 and a fifth insulating layer 16 covering the source/drain metal layer. The first flat layer 15 is disposed on the driving structure layer, and the light-emitting element is disposed on the first flat layer 15. The anode 21 in the light-emitting element is connected with the first drain electrode of the first transistor 101 through a via penetrating through the fifth insulating layer 16 and the first flat layer 15. The binding structure layer of the binding region 200 includes: a first insulating layer 11, a second insulating layer 12, a third insulating layer 13 and a fourth insulating layer 14 made of an inorganic material and stacked on the flexible substrate 10, a first power line 210 and a second power line 220 disposed on the fourth insulating layer 14, and a fifth insulating layer 16 disposed on the first power line 210 and the second power line 220. The first flat layer 15 is disposed on the binding structure layer. An isolation groove 500 and an isolation area 600 are disposed on the first flat layer 15. The isolation groove 500 is disposed in the area where the first power line 210 is located. The isolation groove 500 exposes the surface of the fifth insulating layer 16. The isolation area 600 is provided with a first isolation dam 410 and a second isolation dam 420. The fifth insulating layer 16 in the area where the first isolation dam 410 and the second isolation dam 420 are located is removed to expose the surface of the second power line 220. The first isolation dam 410 and the second isolation dam 420 are disposed on the second power line 220. The inorganic encapsulation layer includes a first encapsulation layer 25 and a third encapsulation layer 27 which are stacked. The first encapsulation layer 25 and the third encapsulation layer 27 of an inorganic material cover the isolation groove 500 and the isolation area 600, and wrap the first isolation dam 410 and the second isolation dam 420.

In an exemplary embodiment, since the first power line 210 is covered by the fifth insulating layer 16, and the isolation groove 500 exposes the surface of the fifth insulating layer 16, there is no possibility that the subsequently formed cathode overlaps the first power line 210, and therefore the distance L2 between the isolation groove 500 and the display region 100 can be greatly reduced. The distance between the subsequently formed cathode edge and the isolation groove 500 can be less than 50 μm, which is not only beneficial to the location and layout of the isolation groove 500 (the isolation groove 500 can be close to the display region 100 so as to extend the distance of the moisture invasion path and enhance the effect of blocking moisture), but also beneficial to simplify the process of preparing the isolation groove and cathode and improve the production efficiency. In an exemplary embodiment, since the edges of the first power line 210 and the second power line 220 are covered by the fifth insulating layer 16, the edges of the first power line 210 and the second power line 220 will not be eroded by etching solution and side pits will not be formed in the subsequent anode etching process, thereby avoiding the formation of moisture circulation paths at the edges of the first power line 210 and the second power line 220 and reducing the number of moisture intrusion paths.

In some possible implementations, the fifth insulating layer 16 in the area where the first isolation dam 410 and the second isolation dam 420 are located may be retained, and the first isolation dam 410 and the second isolation dam 420 may be disposed on the surface of the fifth insulating layer 16. In some possible implementations, the isolation groove 500 may be disposed in the area where the second power line 220 is located, or the isolation groove 500 may be disposed in the area between the first power line 210 and the second power line 220, which is not specifically limited in the present disclosure.

Figure 18:
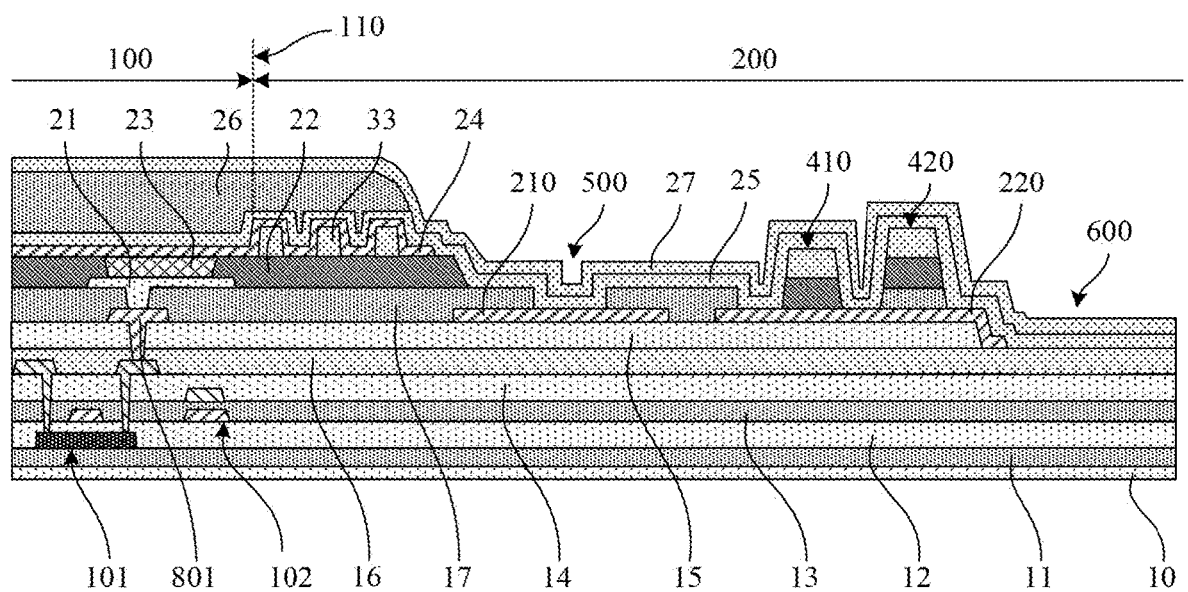
FIG. 18 is a schematic diagram of another structure of a display substrate according to the present disclosure.

FIG. 18 is a schematic diagram of another structure of a display substrate according to the present disclosure, which is a cross-sectional view taken along the line B-B in FIG. 3, illustrating the cross-sectional structure of the display region and the binding region in a double source/drain metal layer (2SD) structure. In a plane direction parallel to the display substrate, the display substrate includes a display region 100 and a binding region 200, and the binding region 200 is located at one side of the display region 100. In the plane direction perpendicular to the display substrate, the display region 100 includes a flexible substrate 10, a driving structure layer disposed on the flexible substrate 10, a light-emitting element disposed on the driving structure layer, and a composite encapsulation layer covering the light-emitting element. The binding region 200 includes a flexible substrate 10, a binding structure layer disposed on the flexible substrate 10, an isolation groove 500 and an isolation area 600 provided with a first isolation dam 410 and a second isolation dam 420 disposed on the binding structure layer, and an inorganic encapsulation layer covering the isolation groove 500, the first isolation dam 410, the second isolation dam 420 and the isolation area 600.

In an exemplary embodiment, the driving structure layer of the display region 100 includes a plurality of transistors and storage capacitors forming a pixel driving circuit, which is illustrated by taking a first transistor 101 and a first storage capacitor 102 as an example in FIG. 18. The driving structure layer of the display region 100 includes: a first insulating layer 11 disposed on the flexible substrate 10, an active layer disposed on the first insulating layer 11, a second insulating layer 12 covering the first active layer, a first gate metal layer disposed on the second insulating layer 12, a third insulating layer 13 covering the first gate metal layer, a second gate metal layer disposed on the third insulating layer 13, a fourth insulating layer 14 covering the second gate metal layer, a source/drain metal layer disposed on the fourth insulating layer 14, a fifth insulating layer 16 covering the source/drain metal layer, a first flat layer 15 disposed on the fifth insulating layer 16, and a metal conductive layer disposed on the first flat layer 15. The active layer includes at least a first active layer, the first gate metal layer includes at least a first gate electrode and a first capacitor electrode, the second gate metal layer includes at least a second capacitor electrode, the source/drain metal layer includes at least a first source electrode and a first drain electrode, the metal conductive layer includes at least a first connection electrode 801, and the first connection electrode 801 is connected with the first drain electrode of the first transistor 101 through a via. The first active layer, the first gate electrode, the first source electrode and the first drain electrode constitute the first transistor 101, and the first capacitor electrode and the second capacitor electrode constitute the first storage capacitor 102. In some embodiments, the source/drain metal layer is called the first source/drain metal layer (SD1), and the metal conductive layer is called the second source/drain metal layer (SD2). A second flat layer 17 is disposed on the driving structure layer of the display region 100. The second flat layer 17 covers the metal conductive layer. The light-emitting element is disposed on the second flat layer 17. The light-emitting element includes an anode 21, a pixel definition layer 22, an organic light-emitting layer 23 and a cathode 24. The anode 21 is connected with the connection electrode 801 through a via formed in the second flat layer 17, thus realizing the connection between the anode 21 and the first drain electrode of the first transistor 101. The composite encapsulation layer includes a first encapsulation layer 25, a second encapsulation layer 26 and a third encapsulation layer 27 which are stacked, and the second encapsulation layer 26 of an organic material is disposed between the first encapsulation layer 25 and the third encapsulation layer 27 of an inorganic material.

The binding structure layer of the binding region 200 includes: a first insulating layer 11, a second insulating layer 12, a third insulating layer 13, a fourth insulating layer 14 and a fifth insulating layer 16 made of an inorganic material and stacked on the flexible substrate 10, a first flat layer 15 made of an organic material and disposed on the fifth insulating layer 16, and a first power line 210 and a second power line 220 disposed on the first flat layer 15, wherein the edge of the second power line 220 away from the display region 100 covers the edge of the first flat layer 15 away from the display region 100. The first power line 210 and the second power line 220 are disposed on the same layer as the metal conductive layer of the display region 100 and formed by the same patterning process. A second flat layer 17 is disposed on the binding structure layer of the binding region 200, and the second flat layer 17 serves as the organic insulating layer of the present disclosure. An isolation groove 500 and an isolation area 600 are disposed on the second flat layer 17. The isolation groove 500 is disposed in the area where the first power line 210 is located. The isolation groove 500 exposes the surface of the first power line 210. The isolation area 600 is disposed on one side of the second power line 220 away from the display region 100. A first isolation dam 410 and a second isolation dam 420 are disposed in the isolation area 600. The first isolation dam 410 and the second isolation dam 420 are disposed on the second power line 220. Except where the first isolation dam 410 and the second isolation dam 420 are located, the surfaces of the second power line 220 and the fifth insulating layer 16 are exposed at other positions of the isolation area 600. The inorganic encapsulation layer includes a first encapsulation layer 25 and a third encapsulation layer 27 which are stacked. The first encapsulation layer 25 and the third encapsulation layer 27 of an inorganic material cover the isolation groove 500 and the isolation area 600, and wrap the first isolation dam 410 and the second isolation dam 420. In addition, a pixel definition layer 22 is disposed on the second flat layer 17 adjacent to the display region 100, a plurality of post spacers 33 are disposed on the pixel definition layer 22 at intervals, and the cathode 24 wraps the plurality of post spacers 33.

In an exemplary embodiment, there may be one or more isolation grooves 500. The width of the isolation groove 500 is about 20 μm to about 50 μm. The distance between the isolation groove 500 and the edge of the display region 110 is smaller than that between the first isolation dam 410 and the edge of the display region 110, and the distance between the isolation groove 500 and the edge of the display region 110 is greater than that between the edge of the cathode 24 and the edge of the display region 110. The isolation groove 500 may be disposed in the area where the second power line 220 is located, and the isolation groove 500 exposes the surface of the second power line 220. Optionally, the isolation groove 500 may be disposed in the area between the first power line 210 and the second power line 220. The first flat layer 15 and the second flat layer 17 in the isolation groove 500 are removed to expose the surface of the fifth insulating layer 16 in the area between the first power line 210 and the second power line 220.

In some possible implementations, the first power line 210 and the second power line 220 may be formed on the fourth insulating layer 14, disposed in the same layer as the source/drain metal layers of the display region 100, and formed by the same patterning process. After the formation of the fifth insulating layer 16, the first flat layer 15 and the second flat layer 17, the first flat layer 15 and the second flat layer 17 in the isolation groove 500 are removed, and the isolation groove 500 exposes the surface of the fifth insulating layer 16. At the position where the second power line 220 is located, the first isolation dam 410 and the second isolation dam 420 are disposed on the second power line 220 by removing the fifth insulating layer 16, the first flat layer 15 and the second flat layer 17 in some areas. In some possible implementations, the isolation groove 500 can be disposed at the position where the second power line 220 is located, or disposed in the area between the first power line 210 and the second power line 220, which is not specifically limited in the present disclosure.

For a display substrate with a double source/drain metal layer (2SD) structure, the moisture intrusion path appearing at the edge of the first power line 210 and the edge of the second power line 220 is blocked by disposing an isolation groove on the second flat layer in the present disclosure. After the moisture flows to the second flat layer along the edge of the first power line 210 and the edge of the second power line 220, it will conduct and diffuse to the display region in the second flat layer. Due to the disposition of an isolation groove on the second flat layer, moisture is blocked by the isolation groove, and it needs to bypass the isolation groove before entering the display region, thus the invasion path is greatly prolonged, thereby reducing the risk of GDS, avoiding display defects of the display substrate and improving the display quality.

Figure 19:
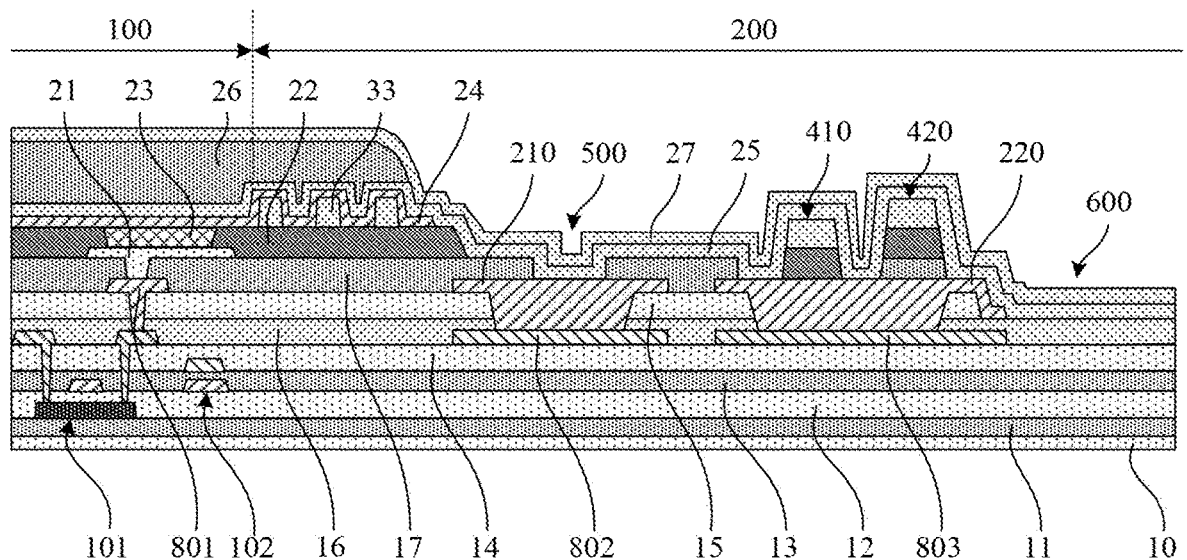
FIG. 19 is a schematic diagram of another structure of a display substrate according to the present disclosure.

FIG. 19 is a schematic diagram of another structure of a display substrate according to the present disclosure, which is a cross-sectional view taken along the line B-B in FIG. 3. The structure in the display region 100, and the structure of the isolation groove, the isolation area, the first isolation dam and the second isolation dam in the binding region 200 are similar to the corresponding structures described in the embodiment shown in FIG. 18, but different from the structures described in the embodiment shown in FIG. 18 in that the binding structure layer of the binding region 200 also includes a second connection electrode 802 and a third connection electrode 803. As shown in FIG. 19, the binding structure layer of the binding region 200 includes: a first insulating layer 11, a second insulating layer 12, a third insulating layer 13 and a fourth insulating layer 14 made of an inorganic material and stacked on the flexible substrate 10, a second connection electrode 802 and a third connection electrode 803 disposed on the fourth insulating layer 14, a fifth insulating layer 16 disposed on the second connection electrode 802 and the third connection electrode 803, a first flat layer 15 disposed on the fifth insulating layer 16, and a first power line 210 and a second power line 220 disposed on the first flat layer 15, wherein the first power line 210 is connected with the second connection electrode 802 through a via penetrating the first flat layer 15 and the fifth insulating layer 16, the second power line 220 is connected with the third connection electrode 803 through a via penetrating the first flat layer 15 and the fifth insulating layer 16, and the edge of the second power line 220 away from the display region 100 covers the edge of the first flat layer 15 away from the display region 100. The second connection electrode 802 and the third connection electrode 803 are disposed on the same layer as the source/drain metal layer of the display region 100 and formed by the same patterning process. The first power line 210 and the second power line 220 are disposed on the same layer as the metal conductive layer of the display region 100 and formed by the same patterning process.

In an exemplary embodiment, by preparing the second connection electrode 802 and the third connection electrode 803 in the binding region 200, the first power line 210 is connected with the second connection electrode 802 through a via, and the second power line 220 is connected with the third connection electrode 803 through a via, which increases the layout flexibility of the first power line 210 and the second power line 220 and is beneficial to optimizing the film structure of the binding region 200.

Figure 20:
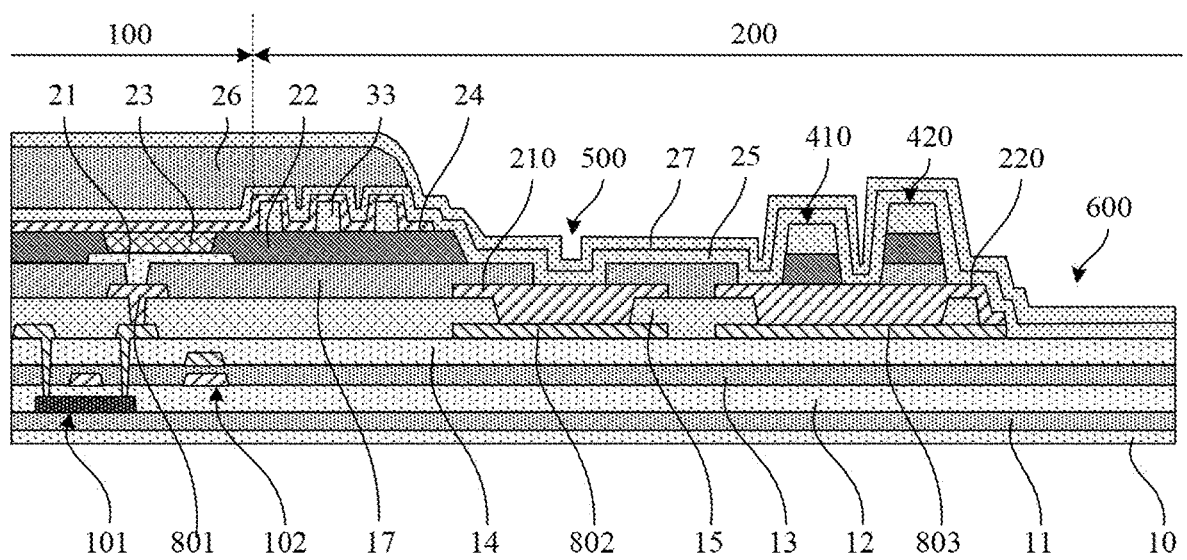
FIG. 20 is a schematic diagram of another structure of a display substrate according to the present disclosure.

FIG. 20 is a schematic diagram of another structure of a display substrate according to the present disclosure, which is a cross-sectional view taken along the line B-B in FIG. 3. The structure in the display region 100, and the structure of the isolation groove, the isolation area, the first isolation dam and the second isolation dam in the binding region 200 are similar to the corresponding structures described in the embodiment shown in FIG. 19, but different from the structures described in the embodiment shown in FIG. 19 in that the binding structure layer of the binding region 200 is not provided with a fifth insulating layer. As shown in FIG. 20, the binding structure layer of the binding region 200 includes: a first insulating layer 11, a second insulating layer 12, a third insulating layer 13 and a fourth insulating layer 14 stacked on the flexible substrate 10, a second connection electrode 802 and a third connection electrode 803 disposed on the fourth insulating layer 14, a first flat layer 15 disposed on the second connection electrode 802 and the third connection electrode 803, and a first power line 210 and a second power line 220 disposed on the first flat layer 15, wherein the first power line 210 is connected with the second connection electrode 802 through a via, and the second power line 220 is connected with the third connection electrode 803 through a via. In an exemplary embodiment, since the fifth insulating layer 16 is not formed, the number of preparation processes is reduced and the process complexity is reduced.

Figure 21:
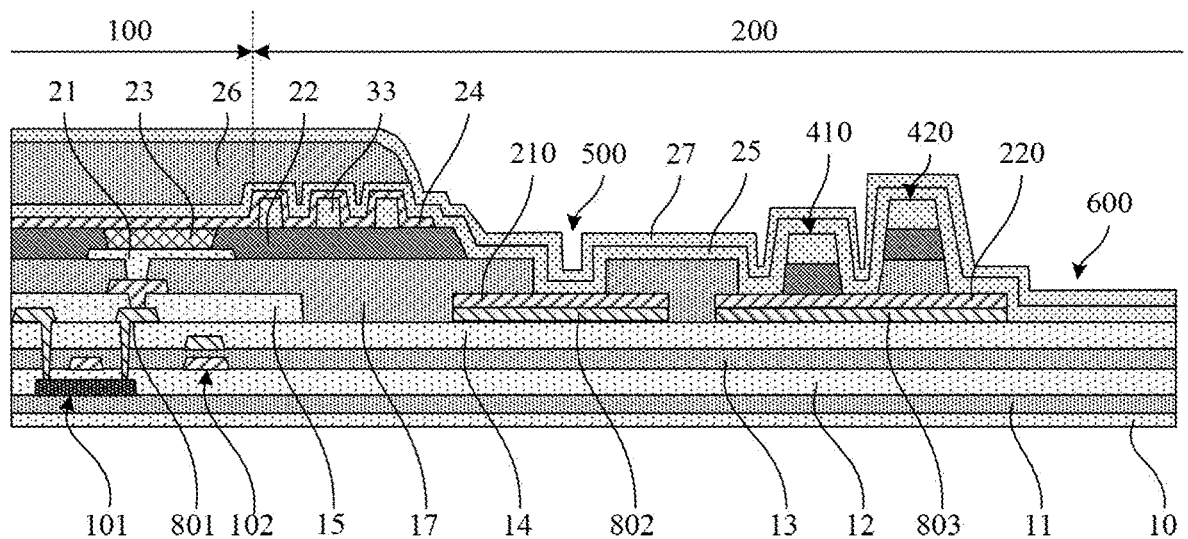
FIG. 21 is a schematic diagram of another structure of a display substrate according to the present disclosure.

FIG. 21 is a schematic diagram of another structure of a display substrate according to the present disclosure, which is a cross-sectional view taken along the line B-B in FIG. 3. The structure in the display region 100, and the structure of the isolation groove, the isolation area, the first isolation dam and the second isolation dam in the binding region 200 are similar to the corresponding structures described in the embodiment shown in FIG. 20, but different from the structures described in the embodiment shown in FIG. 20 in that the first flat layer 15 of the binding region 200 is removed. As shown in FIG. 21, the binding structure layer of the binding region 200 includes: a first insulating layer 11, a second insulating layer 12, a third insulating layer 13 and a fourth insulating layer 14 stacked on the flexible substrate 10, a second connection electrode 802 and a third connection electrode 803 disposed on the fourth insulating layer 14, a first power line 210 disposed on the second connection electrode 802 and a second power line 220 disposed on the third connection electrode 803. In an exemplary embodiment, since the first flat layer 15 of the binding region 200 is removed, the first power line 210 is directly connected with the second connection electrode 802, and the second power line 220 is directly connected with the third connection electrode 803, which not only increases the contact area and the connection reliability, but also reduces the gas generated in the process of preparing the first flat layer 15, and improves the process quality.

In some possible implementations, part of the first flat layer 15 in the binding region 200 may be removed, for example, only the first flat layer 15 at the position where the first power line 210 and the second power line 220 are located is removed, and the first flat layer 15 is remained in other areas, so that the first power line 210 is directly connected with the second connection electrode 802, and the second power line 220 is directly connected with the third connection electrode 803. In some possible implementations, when the display substrate is provided with a fifth insulating layer, the first flat layer and the fifth insulating layer of the binding region 200 can be removed together, or part of the first flat layer and the fifth insulating layer of the binding region 200 are removed, or part of the fifth insulating layer of the binding region 200 and all of the first flat layer of the binding region 200 are removed, which is not specifically limited in the present disclosure.

Figure 22:
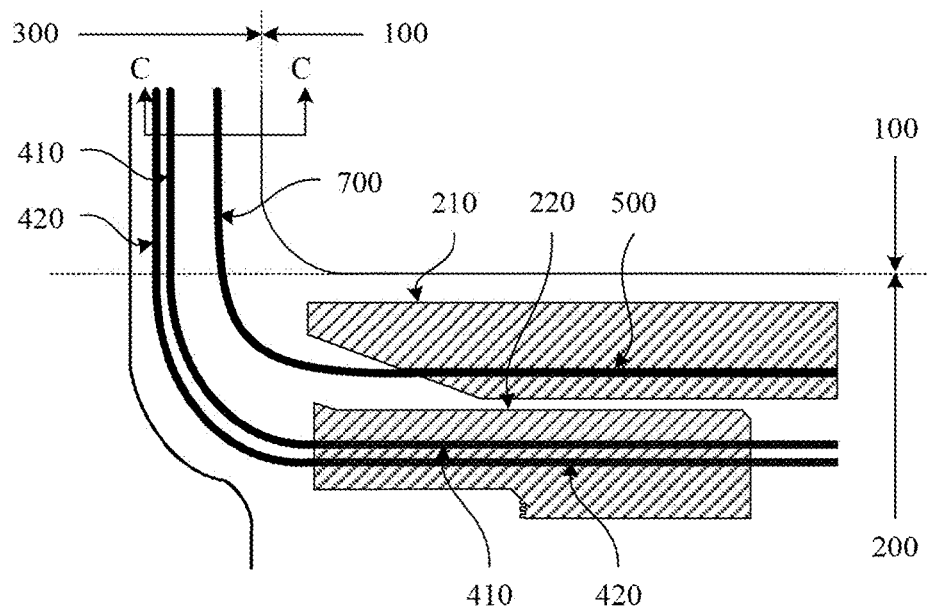
FIG. 22 is a schematic diagram of another structure of a first fan-out area according to the present disclosure.

FIG. 22 is a schematic diagram of another structure of a first fan-out area according to the present disclosure. As shown in FIG. 22, the display substrate includes a display region 100, a binding region 200, and an edge region 300. The binding region 200 is located at one side of the display region 100, and the edge region 300 is located at another side of the display region 100. The binding region 200 includes at least a first fan-out area and a first isolation dam 410, a second isolation dam 420 and an isolation groove 500 located in the first fan-out area. The edge region 300 includes at least a first isolation dam 410, a second isolation dam 420 and a gap 700. The first isolation dam 410 and the second isolation dam 420 of the binding region 200 and the first isolation dam 410 and the second isolation dam 420 of the edge region 300 are an integrated structure disposed on the same layer and prepared simultaneously by the same patterning process, forming an annular structure surrounding the display region 100. In an exemplary embodiment, the isolation groove 500 of the binding region 200 and the gap 700 of the edge region 300 are prepared simultaneously by the same patterning process, and are communicated with each other at the interface between the binding region 200 and the edge region 300.

Figure 23:
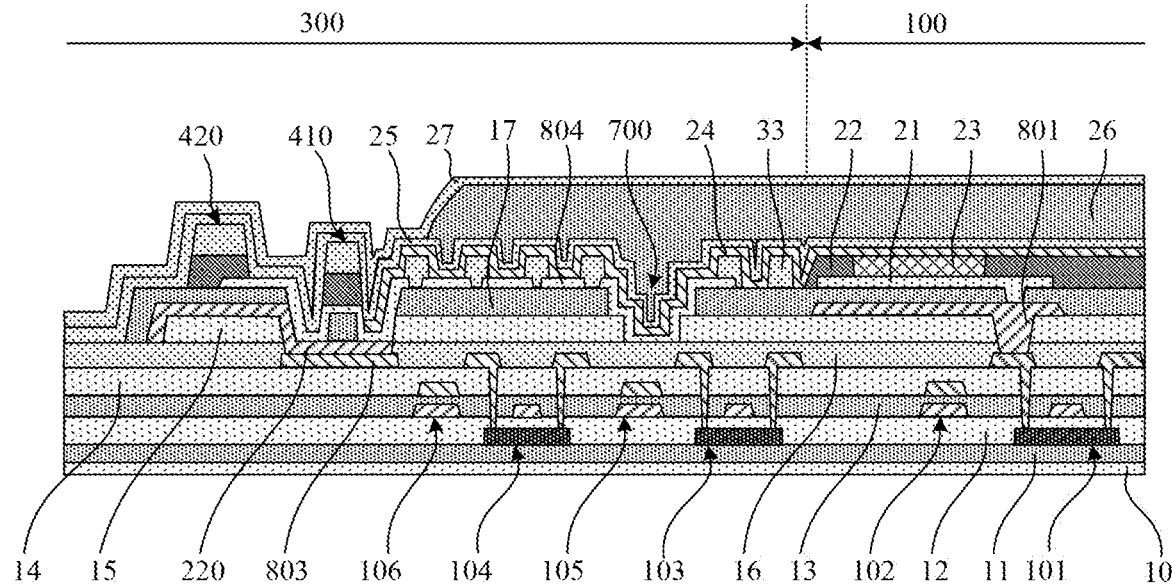
FIG. 23 is a schematic cross-sectional structural diagram of a display region and an edge region in a 2SD structure according to the present disclosure.

FIG. 23 is a schematic cross-sectional structural diagram of a display region and an edge region in a double source/drain metal layer (2SD) structure according to the present disclosure, which is a cross-sectional view taken along the line C-C in FIG. 22. As shown in FIG. 23, in a plane perpendicular to the display substrate, the display region 100 includes a flexible substrate 10, a driving structure layer disposed on the flexible substrate 10, a light-emitting element disposed on the driving structure layer, and a composite encapsulation layer covering the light-emitting element. The edge region 300 includes a flexible substrate 10, a circuit structure layer disposed on the flexible substrate 10, a gap 700, a first isolation dam 410 and a second isolation dam 420 disposed on the circuit structure layer, a composite encapsulation layer covering the gap 700, and an inorganic encapsulation layer wrapping the first isolation dam 410 and the second isolation dam 420.

In an exemplary embodiment, the driving structure layer of the display region 100 includes a plurality of transistors and storage capacitors forming a pixel driving circuit, which is illustrated by taking a first transistor 101 and a first storage capacitor 102 as an example in FIG. 23. The driving structure layer of the display region 100 includes: a first insulating layer 11 disposed on the flexible substrate 10, an active layer disposed on the first insulating layer 11, a second insulating layer 12 covering the active layer, a first gate metal layer disposed on the second insulating layer 12, a third insulating layer 13 covering the first gate metal layer, a second gate metal layer disposed on the third insulating layer 13, a fourth insulating layer 14 covering the second gate metal layer, a source/drain metal layer disposed on the fourth insulating layer 14, a fifth insulating layer 16 and a first flat layer 15 covering the source/drain metal layer, and a metal conductive layer disposed on the first flat layer 15. The active layer includes at least a first active layer, the first gate metal layer includes at least a first gate electrode and a first capacitor electrode, the second gate metal layer includes at least a second capacitor electrode, the source/drain metal layer includes at least a first source electrode and a first drain electrode, the metal conductive layer includes at least a first connection electrode 801, and the first connection electrode 801 is connected with the first drain electrode through a via. The first active layer, the first gate electrode, the first source electrode and the first drain electrode constitute the first transistor 101, and the first capacitor electrode and the second capacitor electrode constitute the first storage capacitor 102. In some embodiments, the source/drain metal layer is called the first source/drain metal layer (SD1), and the metal conductive layer is called the second source/drain metal layer (SD2). A second flat layer 17 is disposed on the driving structure layer of the display region 100. The second flat layer 17 covers the metal conductive layer. The light-emitting element is disposed on the second flat layer 17. The light-emitting element includes an anode 21, a pixel definition layer 22, an organic light-emitting layer 23 and a cathode 24. The anode 21 is connected with the connection electrode 801 through a via formed in the second flat layer 17, thus realizing the connection between the anode 21 and the first drain electrode of the first transistor 101. The composite encapsulation layer includes a first encapsulation layer 25, a second encapsulation layer 26 and a third encapsulation layer 27 which are stacked, and the second encapsulation layer 26 of an organic material is disposed between the first encapsulation layer 25 and the third encapsulation layer 27 of an inorganic material.

In an exemplary embodiment, the circuit structure layer of the edge region 300 includes a plurality of transistors and storage capacitors forming a GOA circuit, which are illustrated by taking two transistors and two storage capacitors as an example in FIG. 23. The circuit structure layer of the edge region 300 includes: a first insulating layer 11 disposed on the flexible substrate 10, an active layer disposed on the first insulating layer 11, a second insulating layer 12 covering the active layer, a first gate metal layer disposed on the second insulating layer 12, a third insulating layer 13 covering the first gate metal layer, a second gate metal layer disposed on the third insulating layer 13, a fourth insulating layer 14 covering the second gate metal layer, a source/drain metal layer disposed on the fourth insulating layer 14, a fifth insulating layer 16 and a first flat layer 15 covering the source/drain metal layer, and a metal conductive layer disposed on the first flat layer 15. The active layer includes at least a second active layer and a third active layer. The first gate metal layer includes at least a second gate electrode, a third gate electrode, a third capacitor electrode, and a fourth capacitor electrode. The second gate metal layer at least includes a fifth capacitor electrode and a sixth capacitor electrode. The source/drain metal layer includes at least a second source electrode, a second drain electrode, a third source electrode, a third drain electrode, and a third connection electrode 803. The metal conductive layer includes at least a second power line 220. The second active layer, the second gate electrode, the second source electrode and the second drain electrode constitute a second transistor 103. The third active layer, the third gate electrode, the third source electrode and the third drain electrode constitute a third transistor 104. The third capacitor electrode and the fifth capacitor electrode constitute a second storage capacitor 105. The fourth capacitor electrode and the sixth capacitor electrode constitute a third storage capacitor 106. In some embodiments, the first transistor 101 may be a driving transistor, the second transistor 103 may be a scan transistor outputting a SCAN signal in the GOA, and the third transistor 104 may be an enable transistor outputting an enable (EM) signal in the GOA. In some embodiments, the driving transistor, the scanning transistor and the enable transistor may be film transistors.

A second flat layer 17 is disposed on the circuit structure layer of the edge region 300. A gap 700, a first isolation dam 410 and a second isolation dam 420 are disposed on the second flat layer 17. The gap 700 is disposed between the second power line 220 and the display region 100. The first flat layer 15 and the second flat layer 17 in the gap 700 are removed to expose the surface of the fifth insulating layer 16. The first isolation dam 410 is disposed at the position of the second power line 220, and the second isolation dam 420 is disposed at one side of the first isolation dam 410 away from the display region 100. The composite encapsulation layer includes a first encapsulation layer 25, a second encapsulation layer 26 and a third encapsulation layer 27 which are stacked. The composite encapsulation layer covers the gap 700. The inorganic encapsulation layer includes the first encapsulation layer 25 and the third encapsulation layer 27 which are stacked. The inorganic encapsulation layer wraps the first isolation dam 410 and the second isolation dam 420. In an exemplary embodiment, a plurality of post spacers 33 are disposed on the second flat layer 17 of the edge region 300 adjacent to the display region 100.

In an exemplary embodiment, the driving structure layer of the display region 100, the binding structure layer of the binding region 200, and the circuit structure layer of the edge region 300 are simultaneously formed by the same process. The first active layer in the driving structure layer is disposed on the same layer as the second active layer and the third active layer in the circuit structure layer, and is formed by the same patterning process. The first gate electrode and the first capacitor electrode in the driving structure layer are disposed on the same layer as the second gate electrode, the third gate electrode, the third capacitor electrode and the fourth capacitor electrode in the circuit structure layer, and are formed by the same patterning process. The second capacitor electrode in the driving structure layer is disposed on the same layer as the fifth capacitor electrode and the sixth capacitor electrode in the circuit structure layer, and is formed by the same patterning process. A first source electrode and a first drain electrode in the driving structure layer, a second connection electrode and a third connection electrode in the binding structure layer, and a second source electrode, a second drain electrode, a third source electrode, a third drain electrode and a third connection electrode in the circuit structure layer are disposed on the same layer and formed by the same patterning process. The first connection electrode in the driving structure layer, the first power line and the second power line in the binding structure layer, and the second power line in the circuit structure layer are disposed on the same layer and formed by the same patterning process.

The second flat layer 17 in the edge region 300 and the gap 700 disposed on the second flat layer 17 are formed by the same process as the second flat layer 17 in the binding region 200 and the isolation groove 500 disposed on the second flat layer 17. The first isolation dam, the second isolation dam, the first encapsulation layer and the third encapsulation layer in the edge region 300 are disposed on the same layer as the first isolation dam, the second isolation dam, the first encapsulation layer and the third encapsulation layer in the binding region 200, and are formed by the same patterning process. In this way, in the process of forming the second flat layer 17, the isolation groove 500 of the binding region 200 and the gap 700 of the edge region 300 are formed synchronously, and they are communicated at the junction of the binding region 200 and the edge region 300 to form an integrated structure. The communicated isolation groove 500 and the gap 700 increase the moisture isolation range, extend the moisture intrusion path, reduce the risk of GDS, avoid display defects of the display substrate, and improve the display quality.

With reference to FIG. 19 and FIG. 23, the preparation process of the display substrate includes steps (11)-(18).

Step (11) includes preparing a flexible substrate 10 on a glass carrier plate 1.

Step (12) includes forming patterns of a driving structure layer, a binding structure layer and a circuit structure layer respectively in the display region 100, the binding region 200 and the edge region 300. The driving structure layer of display region 100 includes a first transistor 101, a first capacitor electrode 102 and a first connection electrode 801. The binding structure layer of the binding region 200 includes a second connection electrode 802 and a third connection electrode 803. The circuit structure layer of the edge region 300 includes a second transistor 103, a third transistor 104, a second storage capacitor 105, a third storage capacitor 106 and a third connection electrode 803. In an exemplary embodiment, the preparation process of the driving structure layer, the binding structure layer and the circuit structure layer may include that:

A pattern of a first insulating layer 11 and a pattern of an active layer disposed on the first insulating layer 11 are formed on the flexible substrate 10, and the active layer includes at least a first active layer, a second active layer and a third active layer.

A pattern of a second insulating layer 12 covering the pattern of the active layer and a pattern of a first gate metal layer disposed on the second insulating layer 12 are formed, wherein the first gate metal layer includes at least a first gate electrode, a second gate electrode, a third gate electrode, a first capacitor electrode, a third capacitor electrode and a fourth capacitor electrode.

A pattern of a third insulating layer 13 covering the first gate metal layer and a pattern of a second gate metal layer disposed on the third insulating layer 13 are formed, wherein the second gate metal layer pattern includes at least a second capacitor electrode, a fifth capacitor electrode and a sixth capacitor electrode.

A pattern of a fourth insulating layer 14 covering the second gate metal layer is formed, wherein a plurality of first vias are disposed on the fourth insulating layer 14. A pattern of a source/drain metal layer is formed on the fourth insulating layer 14, wherein the source/drain metal layer includes at least a first source electrode, a first drain electrode, a second source electrode, a second drain electrode, a third source electrode, a third drain electrode, a second connection electrode 802 and a third connection electrode 803, the first source electrode and the first drain electrode are respectively connected with the first active layer through the first via, the second source electrode and the second drain electrode are respectively connected with the second active layer through the first via, and the third source electrode and the third drain electrode are respectively connected with the third active layer through the first via.

A pattern of a fifth insulating layer 16 covering the source/drain metal layer and a pattern of a first flat layer 15 are formed, wherein a plurality of second vias are formed on the first flat layer 15, the second vias in the display region 100 expose the surface of the first drain electrode of the first transistor 101, the second vias in the binding region 200 expose the surfaces of the second connection electrode 802 and the third connection electrode 803, respectively, and the second vias in the edge region expose the surface of the third connection electrode 803.

A pattern of a metal conductive layer is formed on the first flat layer 15, wherein the metal conductive layer includes at least a first connection electrode 801, a first power line 210 and a second power line 220, the first connection electrode 801 of the display region 100 is connected with the first drain electrode of the first transistor 101 through the second via, the first power line 210 and the second power line 220 of the binding region 200 are connected with the second connection electrode 802 and the third connection electrode 803 through the second via, the second power line 220 of the edge region is connected with the third connection electrode 803 through the second via, and the edge of the second power line 220 away from the display region 100 covers the edge of the first flat layer 15 away from the display region 100.

Step (13) includes forming a pattern of a second flat layer 17. A third via is formed on the second flat layer 17 of the display region 100, and the third via exposes the surface of the first connection electrode 801. An isolation groove 500 and an isolation area 600 are disposed on the second flat layer 17 of the binding region 200. The isolation groove 500 is disposed in the area where the first power line 210 is located. The isolation groove 500 exposes the surface of the first power line 210. The isolation area 600 is disposed on one side of the second power line 220 away from the display region 100. A flat dam foundation is disposed on the second power line 220 in the isolation area 600. Except for the flat dam foundation, the second flat layer 17 in other positions of the isolation area 600 is developed away to expose the surface of the second power line 220 and the surface of the fifth insulating layer 16. A fourth via and a gap 700 are disposed on the second flat layer 17 of the edge region 300. A flat dam foundation is disposed in the fourth via. Except for the flat dam foundation, the second flat layer 17 in the fourth via is developed away to expose the surface of the second power line 220. The gap 700 is disposed between the second power line 220 and the display region 100. The first flat layer 15 and the second flat layer 17 in the gap 700 are developed away to expose the surface of the fifth insulating layer 16. In the area where the gap 700 is located, the orthographic projection of the opening of the second flat layer 17 on the flexible substrate 10 includes the opening of the first flat layer 15, that is, the width of the opening of the second flat layer 17 is larger than that of the first flat layer 15. The opening of the first flat layer 15 exposes the fifth insulating layer 16, and the opening of the second flat layer 17 exposes the opening of the first flat layer 15, forming a step shape on the side wall of the gap 700, so that the cathode subsequently formed also has a step shape to ensure the reliable connection between the cathode and the fourth connection electrode.

Step (14) includes forming patterns of an anode 21 and a fourth connection electrode 804 on the substrate with the above patterns formed thereon. The anode 21 is formed on the second flat layer 17 of the display region 100 and connected with the first connection electrode 801 through the third via. The fourth connection electrode 804 is formed on the second flat layer 17 of the edge region 300. One part of the fourth connection electrode 804 is connected with the second power line 220 through the fourth via, and the other part is disposed in the gap 700. The fourth connection electrode 804 between the fourth via and the gap 700 is provided with a plurality of vias. Since the side wall of the gap 700 is in a step shape, the fourth connection electrode 804 disposed in the gap 700 is also in a step shape.

Step (15) includes forming patterns of a pixel definition layer 22, a first dam foundation and a second dam foundation on the substrate with the above patterns formed thereon. A pixel opening is disposed on the pixel definition layer 22 of the display region 100, and the pixel opening exposes the surface of the anode 21. The first dam foundation and the second dam foundation are formed in the binding region 200 and the edge region 300. The first dam foundation of the binding region 200 is formed on the second power line 220, and the second dam foundation is formed on the flat dam foundation. The first dam foundation of the edge region 300 is disposed in the fourth via, and the second dam foundation is disposed on the second flat layer 17 on one side of the first dam foundation away from the display region 100.

Step (16) includes forming patterns of a plurality of isolation columns 33 in the binding region 200 and the edge region 300. The plurality of isolation columns 33 are respectively disposed on the pixel definition layer 22, the first dam foundation, the second dam foundation and both sides of the gap 700. The first support dam 410 and the second support dam 420 are synchronously formed in the binding region 200 and the edge region 300. The binding region 200 and the first support dam 410 of the edge region 300 are an integrated structure, and the binding region 200 and the second support dam 420 of the edge region 300 are an integrated structure.

Step (17) includes sequentially forming an organic light-emitting layer 23 and a cathode 24 on the substrate with the above patterns formed thereon. The organic light-emitting layer 23 is formed in the pixel opening. Since the anode 21 is connected with the first connection electrode 801, and the first connection electrode 801 is connected with the drain electrode of the first transistor 101, the light emission control of the organic light-emitting layer 23 is realized. One part of the cathode 24 is formed on the organic light-emitting layer 23 of the display region 100, and the other part is formed in the binding region 200 and the edge region 300. The cathode 24 of the binding region 200 wraps a plurality of post spacers 33 on the pixel definition layer 22. The cathode 24 of the edge region 300 is connected with the fourth connection electrode 804 through the gap 700 and the fourth via. Since the fourth connection electrode 804 is connected with the second power line 220, the connection between the cathode 24 and the second power line 220 is realized. Since the fourth connection electrode 804 at the position of the gap 700 is in a step shape, the formed cathode 24 is also in a step shape, and contacts with the fourth connection electrode 804 on different steps, thus ensuring reliable connection between the cathode and the fourth connection electrode 804.

Step (18) includes forming an encapsulation layer on the basis of forming the above patterns, wherein the encapsulation layer includes a first encapsulation layer 25, a second encapsulation layer 26 and a third encapsulation layer 27 which are stacked. The first encapsulation layer 25 is made of an inorganic material, and covers the cathode 24 in the display region 100. In the binding region 200, it wraps the plurality of post spacers 33, covers the isolation groove 500, covers the isolation area 600, and wraps the first support dam 410 and the second support dam 420, respectively. In the edge region 300, it wraps the plurality of post spacers 33, covers the gap 700, and wraps the first support dam 410 and the second support dam 420. The second encapsulation layer 26 is made of an organic material, and is disposed in the display region 100, the area of the binding region 200 where the post spacer 33 is located, and the area of the edge region 300 where the post spacer 33 is located. The third encapsulation layer 27 is made of an inorganic material, and it covers the first encapsulation layer 25 and the second encapsulation layer 26.

Figure 24:
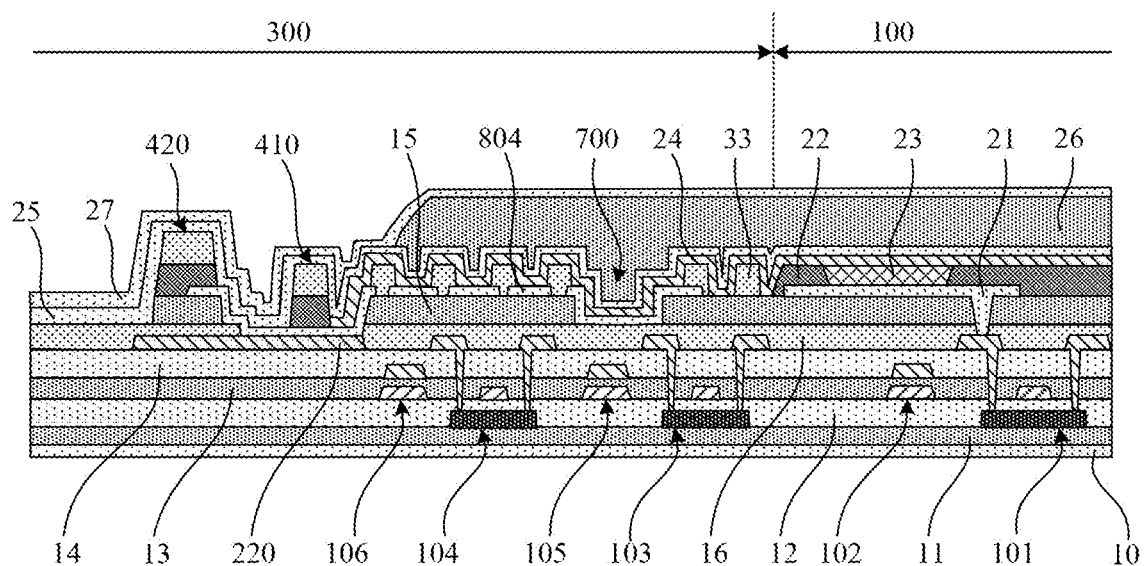
FIG. 24 is a schematic cross-sectional structural diagram of a display region and an edge region in a 1SD structure according to the present disclosure.

FIG. 24 is a schematic cross-sectional structural diagram of a display region and an edge region in a single source/drain metal layer (1SD) structure according to the present disclosure, which is a cross-sectional view taken along the line C-C in FIG. 22. As shown in FIG. 24, in a plane perpendicular to the display substrate, the display region 100 includes a flexible substrate 10, a driving structure layer disposed on the flexible substrate 10, a light-emitting element disposed on the driving structure layer, and a composite encapsulation layer covering the light-emitting element. The edge region 300 includes a flexible substrate 10, a circuit structure layer disposed on the flexible substrate 10, a gap 700, a first isolation dam 410 and a second isolation dam 420 disposed on the circuit structure layer, a composite encapsulation layer covering the gap 700, and an inorganic encapsulation layer wrapping the first isolation dam 410 and the second isolation dam 420.

In an exemplary embodiment, the driving structure layer of the display region 100 includes a plurality of transistors and storage capacitors forming a pixel driving circuit, and the circuit structure layer of the edge region 300 includes a plurality of transistors and storage capacitors forming a GOA circuit, which are illustrated by taking three transistors and three storage capacitors as an example in FIG. 24. The driving structure layer and circuit structure layer include: a first insulating layer 11 disposed on the flexible substrate 10, an active layer disposed on the first insulating layer 11, a second insulating layer 12 covering the active layer, a first gate metal layer disposed on the second insulating layer 12, a third insulating layer 13 covering the first gate metal layer, a second gate metal layer disposed on the third insulating layer 13, a fourth insulating layer 14 covering the second gate metal layer, a source/drain metal layer disposed on the fourth insulating layer 14 and a fifth insulating layer 16 covering the source/drain metal layer. The active layer includes at least a first active layer, a second active layer, and a third active layer. The first gate metal layer includes at least a first gate electrode, a second gate electrode, a third gate electrode, a first capacitor electrode, a third capacitor electrode and a fourth capacitor electrode. The second gate metal layer includes at least a second capacitor electrode, a fifth capacitor electrode and a sixth capacitor electrode. The source/drain metal layer includes at least a first source electrode, a first drain electrode, a second source electrode, a second drain electrode, a third source electrode, a third drain electrode and a second power line 220. The first active layer, the first gate electrode, the first source electrode and the first drain electrode constitute a first transistor 101. The second active layer, the second gate electrode, the second source electrode and the second drain electrode constitute a second transistor 103. The third active layer, the third gate electrode, the third source electrode and the third drain electrode constitute a third transistor 104. The first capacitor electrode and the second capacitor electrode constitute a first storage capacitor 102. The third capacitor electrode and the fifth capacitor electrode constitute a second storage capacitor 105. The fourth capacitor electrode and the sixth capacitor electrode constitute a third storage capacitor 106.

A first flat layer 15 is disposed on the driving structure layer and the circuit structure layer. The light-emitting element of the display region 100 is disposed on the first flat layer 15. The light-emitting element includes an anode 21, a pixel definition layer 22, an organic light-emitting layer 23 and a cathode 24. The anode 21 is connected with the first drain electrode of the first transistor 101 through a via disposed on the first flat layer 15. A gap 700, post spacers 33, a first isolation dam 410 and a second isolation dam 420 are disposed on the first flat layer 15 of the edge region 300. The gap 700 is disposed between the second power line 220 and the display region 100. The first flat layer 15 in the gap 700 is removed to expose the surface of the fifth insulating layer 16. A plurality of post spacers 33 are located on the first flat layer 15 of the edge region 300 adjacent to the display region 100. The first isolation dam 410 and the second isolation dam 42 are disposed at the position of the second power line 220, and the second isolation dam 420 is disposed at one side of the first isolation dam 410 away from the display region 100. The composite encapsulation layer includes a first encapsulation layer 25, a second encapsulation layer 26 and a third encapsulation layer 27 which are stacked. The composite encapsulation layer covers the gap 700 and a plurality of spacer posts 33 in the display region 100 and the edge region 300. The inorganic encapsulation layer includes the first encapsulation layer 25 and the third encapsulation layer 27 which are stacked. The inorganic encapsulation layer wraps the first isolation dam 410 and the second isolation dam 420.

In an exemplary embodiment, the driving structure layer of the display region 100, the binding structure layer of the binding region 200, and the circuit structure layer of the edge region 300 are simultaneously formed by the same process. The first flat layer 15 in the edge region 300 and the gap 700 disposed on the first flat layer 15 are formed by the same process as the first flat layer 15 in the binding region 200 and the isolation groove 500 disposed on the first flat layer 15. The first isolation dam, the second isolation dam, the first encapsulation layer and the third encapsulation layer in the edge region 300 are disposed on the same layer as the first isolation dam, the second isolation dam, the first encapsulation layer and the third encapsulation layer in the binding region 200, and are formed by the same patterning process. In this way, in the process of forming the first flat layer 15, the isolation groove 500 of the binding region 200 and the gap 700 of the edge region 300 are formed synchronously, and they are communicated at the junction of the binding region 200 and the edge region 300 to form an integrated structure. The communicated isolation groove 500 and the gap 700 increase the moisture isolation range, extend the moisture intrusion path, reduce the risk of GDS, avoid display defects of the display substrate, and improve the display quality.

With reference to FIG. 17 and FIG. 24, the preparation process of the display substrate includes: steps (21)-(28).

Step (21) includes preparing a flexible substrate 10 on a glass carrier plate 1.

Step (22) includes forming patterns of a driving structure layer, a binding structure layer and a circuit structure layer respectively in the display region 100, the binding region 200 and the edge region 300. In an exemplary embodiment, the preparation process of the driving structure layer, the binding structure layer and the circuit structure layer may include that:

A pattern of a first insulating layer 11 and a pattern of an active layer disposed on the first insulating layer 11 are formed on the flexible substrate 10, and the active layer includes at least a first active layer, a second active layer and a third active layer.

A pattern of a second insulating layer 12 covering the pattern of the active layer and a pattern of a first gate metal layer disposed on the second insulating layer 12 are formed, and the first gate metal layer includes at least a first gate electrode, a second gate electrode, a third gate electrode, a first capacitor electrode, a third capacitor electrode and a fourth capacitor electrode.

A pattern of a third insulating layer 13 covering the first gate metal layer and a pattern of a second gate metal layer disposed on the third insulating layer 13 are formed, and the second gate metal layer includes at least a second capacitor electrode, a fifth capacitor electrode and a sixth capacitor electrode.

A pattern of a fourth insulating layer 14 covering the second gate metal layer is formed, wherein a plurality of first vias are disposed on the fourth insulating layer 14. A pattern of a source/drain metal layer is formed on the fourth insulating layer 14, wherein the source/drain metal layer includes at least a first source electrode, a first drain electrode, a second source electrode, a second drain electrode, a third source electrode, a third drain electrode and a second power line 220, the first source electrode and the first drain electrode are respectively connected with the first active layer through the first via, the second source electrode and the second drain electrode are respectively connected with the second active layer through the first via, and the third source electrode and the third drain electrode are respectively connected with the third active layer through the first via.

A fifth insulating layer 16 covering the source/drain metal layers is formed.

Step (23) includes forming a pattern of a first flat layer 15. A via is disposed on the first flat layer 15 of the display region 100, and the via exposes the surface of the first drain electrode of the first transistor 101. An isolation groove 500 and an isolation area 600 are formed on the first flat layer 15 of the binding region 200. The isolation groove 500 is disposed in the area where the first power line 210 is located. The isolation groove 500 exposes the surface of the first power line 210. The isolation area 600 is disposed on one side of the second power line 220 away from the display region 100, and a flat dam foundation is disposed on the second power line 220 in the isolation area 600. A fourth via and a gap 700 are disposed on the first flat layer 15 of the edge region 300. The fourth via exposes the surface of the second power line 220. The gap 700 is disposed between the second power line 220 and the display region 100, and the gap 700 exposes the surface of the fifth insulating layer 16. The flat dam foundation is disposed on one side of the fourth via away from the display region 100.

Step (24) includes forming patterns of an anode 21 and a fourth connection electrode 804 on the substrate with the above patterns formed thereon. The anode 21 is formed on the first flat layer 15 of the display region 100 and connected with the first drain electrode of the first transistor 101 through the via. The fourth connection electrode 804 is formed on the first flat layer 15 of the edge region 300. One part of the fourth connection electrode 804 is connected with the second power line 220 through the fourth via, and the other part is disposed in the gap 700. The fourth connection electrode 804 between the fourth via and the gap 700 is provided with a plurality of vias.

Step (25) includes forming patterns of a pixel definition layer 22, a first dam foundation and a second dam foundation on the substrate with the above patterns formed thereon. A pixel opening is disposed on the pixel definition layer 22 of the display region 100, and the pixel opening exposes the surface of the anode 21. The first dam foundation and the second dam foundation are formed in the binding region 200 and the edge region 300. The first dam foundation of the binding region 200 is formed on the second power line 220, and the second dam foundation is formed on the flat dam foundation. The first dam foundation in the edge region 300 is disposed in the fourth via, and the second dam foundation is disposed on the flat dam foundation.

Step (26) includes forming patterns of a plurality of isolation columns 33 in the binding region 200 and the edge region 300. The plurality of isolation columns 33 are respectively disposed on the pixel definition layer 22, the first dam foundation, the second dam foundation and both sides of the gap 700. The first support dam 410 and the second support dam 420 are synchronously formed in the binding region 200 and the edge region 300. The binding region 200 and the first support dam 410 of the edge region 300 are an integrated structure, and the binding region 200 and the second support dam 420 of the edge region 300 are an integrated structure.

Step (27) includes sequentially forming an organic light-emitting layer 23 and a cathode 24 on the substrate with the above patterns formed thereon. The organic light-emitting layer 23 is formed in the pixel opening, and one part of the cathode 24 is formed on the organic light-emitting layer 23 of the display region 100, and the other part is formed in the binding region 200 and the edge region 300. The cathode 24 of the binding region 200 wraps a plurality of post spacers 33 on the pixel definition layer 22. The cathode 24 of the edge region 300 is connected with the fourth connection electrode 804 through the gap 700 and the fourth via. Since the fourth connection electrode 804 is connected with the second power line 220, the connection between the cathode 24 and the second power line 220 is realized.

Step (28) includes forming an encapsulation layer on the basis of forming the above patterns, wherein the encapsulation layer includes a first encapsulation layer 25, a second encapsulation layer 26 and a third encapsulation layer 27 which are stacked. The first encapsulation layer 25 is made of an inorganic material, and covers the cathode 24 in the display region 100. In the binding region 200, it wraps the plurality of post spacers 33, covers the isolation groove 500, covers the isolation area 600, and wraps the first support dam 410 and the second support dam 420, respectively. In the edge region 300, it wraps the plurality of post spacers 33, covers the gap 700, and wraps the first support dam 410 and the second support dam 420. The second encapsulation layer 26 is made of an organic material, and is disposed in the display region 100, the area of the binding region 200 where the post spacer 33 is located, and the area of the edge region 300 where the post spacer 33 is located. The third encapsulation layer 27 is made of an inorganic material, and it covers the first encapsulation layer 25 and the second encapsulation layer 26.

The structure of the edge region shown in FIG. 23 and FIG. 24 is only an exemplary explanation. In an exemplary embodiment, edge structures such as the second power line 220, the first support dam 410 and the second support dam 420 may be changed according to actual needs. For example, the driving structure layer, the binding structure layer, and the circuit structure layer may be not provided with the fifth insulating layer 16. As another example, the second power line 220 may extend to one side away from the display region 100. For another example, a plurality of gaps 700 may be provided, which is not specifically limited in the present disclosure.

Figure 25:
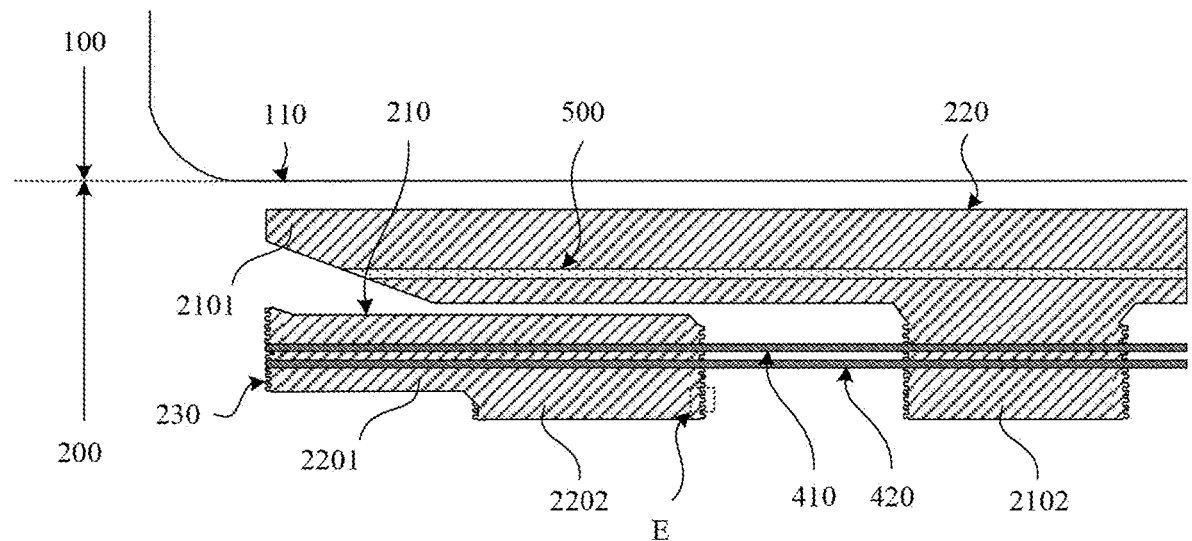
FIG. 25 is a schematic diagram of another structure of a first fan-out area according to the present disclosure.
Figure 26:
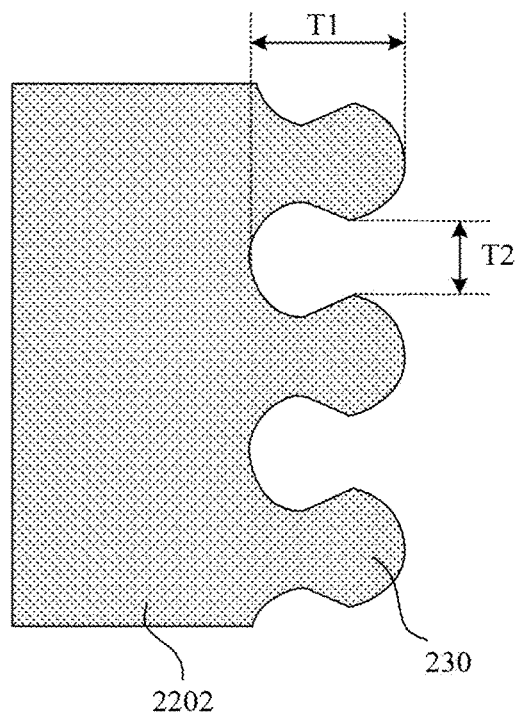
FIG. 26 is an enlarged view of area E in FIG. 25.

FIG. 25 and FIG. 26 are schematic diagrams of another structure of a first fan-out area according to the present disclosure, and FIG. 26 is an enlarged view of the area E in FIG. 25. As shown in FIG. 25, in the plane parallel to the display substrate, the binding region 200 is located at one side of the display region 100, and the first fan-out area of the binding region 200 is adjacent to the edge of the display region 110. The first fan-out area includes a first power line 210, a second power line 220, a first isolation dam 410, a second isolation dam 420, and at least one isolation groove 500.

The first power line 210 is connected with a high voltage power line VDD of the display region 100, the second power line 220 is connected with a low voltage power line VSS of the edge region 300, the first isolation dam 410 and the second isolation dam 420 extend in a direction parallel to the edge of the display region 110, and the at least one isolation groove 500 extends in a direction parallel to the edge of the display region 110, and the distance between the isolation groove 500 and the edge of the display region 110 is smaller than the distance between the first isolation dam 410 and the edge of the display region 110. The first power line 210 includes a first strip block 2101 extending in a direction parallel to the edge of the display region 110 and a second strip block 2102 extending in a direction away from the display region 100. One end of the second strip block 2102 adjacent to the display region 100 is connected with the first strip block 2101 to form a T-shaped structure. The second power line 220 includes a third strip block 2201 extending in a direction parallel to the edge of the display region 110 and a fourth strip block 2202 extending in a direction away from the display region 100. One end of the fourth strip block 2202 adjacent to the display region 100 is connected with the third strip block 2201 to form an angular structure. In an exemplary embodiment, the edges of the first power line 210 and the second power line 220 are provided with a wave structure 230. Along the direction away from the display region 100, the wave structure 230 may be disposed on the edges of both sides of the second strip block 2102 in the first power line 210, or on the edges of both sides of the second power line 220. In some embodiments, the wave structure 230 may be disposed on the edges of the first power line 210 and the second power line 220 on one side of the isolation groove 500 away from the display region 100, or the wave structure 230 may be disposed on the edges of the first power line 210 and the second power line 220 on one side of the first isolation dam 410 away from the display region 100, or the wave structure 230 may be disposed on the edges of the first power line 210 and the second power line 220 on one side of the second isolation dam 420 away from the display region 100, or the wave structure 230 may be may be disposed on the edges of the first power line 210 and the second power line 220 in the area where the first power line 210 and the second power line 220 overlap with the first isolation dam 410 and the second isolation dam 420.

As shown in FIG. 26, the wave structure 230 includes a plurality of protrusions disposed at intervals and depressions between the plurality of protrusions, forming wavy edges of the first power line 210 and the second power line 220. As for the moisture transmission path appearing at the edges of the first power line 210 and the second power line 220, by disposing the edges of the first power line 210 and the second power line 220 to be wavy, the length of the moisture transmission path can be increased, to sluggish and alleviate the diffusion of moisture. In an exemplary embodiment, the height T1 of the protrusions between the highest point on the outside and the lowest point on the inside in the wave structure 230 is about 30 µm to about 60 µm, and the distance T2 between adjacent protrusions is about 20 µm to about 50 µm.

The wave structure shown in FIG. 25 and FIG. 26 is only an exemplary illustration. In an exemplary embodiment, the position and shape of the wave structure 230 can be changed according to actual needs. For example, along the direction away from the display region 100, the wave structure 230 may be disposed only on the edges on both sides of the power line in the area between the first isolation dam 410 and the second isolation dam 420. For another example, along the direction away from the display region 100, the wave structure 230 may be disposed only on the edges of both sides of the power line in the area on one side of the second isolation dam 420 away from the display region 100. For another example, the wave structure 230 may be disposed only on the edge of one side of the second power line 220 toward the second strip block 2102 and on the edge of one side of the second strip block 2102 toward the second power line 220. For another example, the wave structure 230 may be disposed only on the edge of one side of the second power line 220 away from the second strip block 2102 and on the edge of one side of the second strip block 2102 away from the second power line 220. For another example, the protrusions and depressions in the wave structure can be composed of multiple arcs, or of multiple straight lines, or of multiple arcs and multiple straight lines, which is not specifically limited in the present disclosure.

The present disclosure also provides a preparation method of a display substrate, which includes a display region and a binding region located at one side of the display region, and the preparation method includes the following steps S1-S4.

Step S1 includes forming a driving structure layer and a binding structure layer in the display region and the binding region respectively. The driving structure layer includes a pixel driving circuit, and the binding structure layer includes a power line connected with the pixel driving circuit.

Step S2 includes forming an organic insulating layer on the driving structure layer and the binding structure layer. At least one isolation groove is formed on the organic insulating layer on the binding structure layer.

Step S3 includes forming a light-emitting element and an isolation dam in the display region and the binding region respectively. The light-emitting element is connected with the pixel driving circuit, and the distance between the isolation groove and an edge of the display region is smaller than the distance between the isolation dam and the edge of the display region.

Step S4 includes forming an inorganic encapsulation layer in the binding region. The inorganic encapsulation layer covers the isolation groove and wraps the isolation dam.

In an exemplary embodiment, forming a light-emitting element and an isolation dam in the display region and the binding region respectively includes: forming a light-emitting element in the display region, wherein the light-emitting element is connected with the pixel driving circuit; forming a first isolation dam and a second isolation dam in the binding region, wherein the distance between the first isolation dam and the edge of the display region is smaller than that between the second isolation dam and the edge of the display region, and the distance between the isolation groove and the edge of the display region is smaller than that between the first isolation dam and the edge of the display region.

In an exemplary embodiment, forming a light-emitting element in the display region includes: sequentially forming an anode, a pixel definition layer, an organic light-emitting layer, and a cathode on the organic insulating layer, wherein the anode is connected with the pixel driving circuit, the pixel definition layer and the cathode extend to the binding region; along the direction away from the display region, the distance between the cathode edge and the edge of the display region in the binding region is smaller than that between the isolation groove and the edge of the display region.

In an exemplary embodiment, the power line includes a first power line and a second power line, and the isolation groove is disposed on the first power line, or disposed on the second power line, or disposed between the first power line and the second power line. The width of the isolation groove is 20 µm to 70 µm along the direction away from the display region.

In an exemplary embodiment, the display substrate further includes an edge region, and the preparation method further includes: forming a circuit structure layer on the edge region, forming an organic insulating layer on the circuit structure layer, wherein at least one gap is formed on the organic insulating layer, and the isolation groove of the binding region is communicated with the gap of the edge region and formed by the same process.

In an exemplary embodiment, the binding structure layer of the binding region includes a composite insulating layer disposed on the substrate and a first power line and a second power line disposed on the composite insulating layer. Optionally, the binding structure layer of the binding region includes a composite insulating layer disposed on the substrate, a first power line and a second power line disposed on the composite insulating layer and a fifth insulating layer disposed on the first power line and the second power line. Optionally, the binding structure layer of the binding region includes a composite insulating layer disposed on the substrate, a fifth insulating layer disposed on the composite insulating layer, a first flat layer disposed on the fifth insulating layer, and first and second power lines disposed on the first flat layer. Optionally, the binding structure layer of the binding region includes a composite insulating layer disposed on the substrate, a first power line and a second power line disposed on the composite insulating layer, a fifth insulating layer disposed on the first power line and the second power line, and a first flat layer disposed on the fifth insulating layer. Optionally, the binding structure layer of the binding region includes a composite insulating layer disposed on the substrate, second and third connection electrodes disposed on the composite insulating layer, a fifth insulating layer covering the second and third connection electrodes, a first flat layer disposed on the fifth insulating layer, and first and second power lines disposed on the first flat layer, wherein the first power line is connected with the second connection electrode through a via, and the second power line is connected with the third connection electrode through a via. The organic insulating layer disposed on the binding structure layer includes a first flat layer or includes a second flat layer. The composite insulating layer includes a first insulating layer, a second insulating layer, a third insulating layer and a fourth insulating layer which are stacked on the substrate.

In an exemplary embodiment, the edge of the power line is provided with a wave structure, wherein the wave structure is disposed on the edge of the power line on one side of the isolation groove away from the display region, or the wave structure is disposed on the edge of the power line on one side of the isolation dam away from the display region, or the wave structure is disposed on the edge of the power line in the overlapping area between the power line and the isolation dam. The wave structure includes a plurality of protrusions disposed at intervals, and the protrusion height of the protrusions is about 30 μm to about 60 μm.

The present disclosure further provides a display device including the display substrate in aforementioned embodiments. The display device may be any product or component with a display function such as a mobile phone, a tablet computer, a television, a display, a notebook computer, a digital photo frame, a navigator, etc.

The accompanying drawings of the present application only refer to structures involved in the present disclosure, and other structures may refer to general designs. Without conflict, the embodiments of the present disclosure, i.e., the features in the embodiments may be combined with each other to obtain a new embodiment.

Those of ordinary skills in the art will appreciate that modifications or equivalent substitutions may be made to the technical solutions of the present disclosure without departing from the spirit and scope of the technical solutions of the present disclosure, all of which should be contained within the scope of the claims of the present application.

What we claim is:

1. A display substrate, comprising a display region and a binding region located at one side of the display region, wherein
the display region comprises a driving structure layer, an organic insulating layer disposed on the driving structure layer and a light-emitting element disposed on the organic insulating layer, the driving structure layer comprises a pixel driving circuit, and the light-emitting element is connected with the pixel driving circuit;
the binding region comprises a binding structure layer, an organic insulating layer and an isolation dam disposed on the binding structure layer, and an inorganic encapsulation layer disposed on the organic insulating layer and the isolation dam, the binding structure layer comprises a power line connected with the pixel driving circuit; and
at least one isolation groove is disposed on the organic insulating layer of the binding region, the inorganic encapsulation layer covers the isolation groove and wraps the isolation dam, and the distance between the isolation groove and an edge of the display region is smaller than the distance between the isolation dam and the edge of the display region;
wherein the power line comprises a first power line and a second power line, and the isolation groove is disposed on the first power line;
wherein along the direction of the edge of the display region, an orthographic projection of the isolation groove on a substrate comprises an orthographic projection of the first power line on the substrate;
wherein a surface of the first power line is exposed in the isolation groove, and the encapsulation layer covers the exposed surface of the first power line in the isolation groove.

2. The display substrate according to claim 1, wherein
the isolation dam comprises a first isolation dam and a second isolation dam, the distance between the first isolation dam and the edge of the display region is smaller than the distance between the second isolation dam and the edge of the display region; and
the distance between the isolation groove and the edge of the display region is smaller than the distance between the first isolation dam and the edge of the display region.

3. The display substrate according to claim 2, wherein
the light-emitting element comprises an anode, a pixel definition layer, an organic light-emitting layer and a cathode, the pixel definition layer and the cathode extend to the binding region; and
along the direction away from the display region, the distance between an edge of the cathode and the edge of the display region in the binding region is smaller than the distance between the isolation groove and the edge of the display region.

4. The display substrate according to claim 1, wherein the width of the isolation groove is 20 μm to 70 μm along the direction away from the display region.

5. The display substrate according to claim 1, the display substrate further comprises an edge region which comprises a circuit structure layer and an organic insulating layer disposed on the circuit structure layer, a gap is disposed on the organic insulating layer, and the isolation groove of the binding region is communicated with the gap of the edge region.

6. The display substrate according to claim 1, wherein
the first power line comprises a first strip block and a second strip block, the first strip block extends along a direction of the edge of the display region, the second strip block extends along a direction away from the display region, and an end of the second strip block adjacent to the display region is connected with the first strip block to form a T-shaped structure; and
the second power line is located at one side of the first strip block away from the display region, the isolation dam is disposed on the second strip block and the second power line, and the isolation groove is disposed on the first strip block.

7. The display substrate according to claim 1, wherein
the binding structure layer of the binding region comprises a composite insulating layer disposed on the substrate and a first power line and a second power line disposed on the composite insulating layer; or, the binding structure layer of the binding region comprises a composite insulating layer disposed on the substrate, a first power line and a second power line disposed on the composite insulating layer, and a fifth insulating layer disposed on the first power line and the second power line;
the organic insulating layer disposed on the binding structure layer comprises a first flat layer; and
the composite insulating layer comprises a first insulating layer, a second insulating layer, a third insulating layer and a fourth insulating layer which are stacked on the substrate.

8. The display substrate according to claim 1, wherein the binding structure layer of the binding region comprises a composite insulating layer disposed on the substrate, a fifth insulating layer disposed on the composite insulating layer, a first flat layer disposed on the fifth insulating layer, and a first power line and a second power line disposed on the first flat layer; or, the binding structure layer of the binding region comprises a composite insulating layer disposed on the substrate, a first power line and a second power line disposed on the composite insulating layer, a fifth insulating layer disposed on the first power line and the second power line, and a first flat layer disposed on the fifth insulating layer; or, the binding structure layer of the binding region comprises a composite insulating layer disposed on the substrate, a second connection electrode and a third connection electrode disposed on the composite insulating layer, a fifth insulating layer covering the second connection electrode and the third connection electrode, a first flat layer disposed on the fifth insulating layer, and a first power line and a second power line disposed on the first flat layer, the first power line is connected with the second connection electrode through a via, and the second power line is connected with the third connection electrode through the via;
the organic insulating layer disposed on the binding structure layer comprises a second flat layer; and
the composite insulating layer comprises a first insulating layer, a second insulating layer, a third insulating layer and a fourth insulating layer which are stacked on the substrate.

9. The display substrate according to claim 1, wherein
an edge of the power line is provided with a wave structure; and
the wave structure is disposed on the edge of the power line on one side of the isolation groove away from the display region, or the wave structure is disposed on the edge of the power line on one side of the isolation dam away from the display region, or the wave structure is disposed on the edge of the power line in an area where the power line overlaps with the isolation dam.

10. The display substrate according to claim 9, wherein the wave structure comprises a plurality of protrusions disposed at intervals, and a protrusion height of the protrusion is 30 μm to 60 μm.

11. A display device, comprising the display substrate according to claim 1.

12. A preparation method of a display substrate, the display substrate comprising a display region and a binding region located at one side of the display region, the preparation method comprising:

forming a driving structure layer and a binding structure layer in the display region and the binding region respectively, wherein the driving structure layer comprises a pixel driving circuit, and the binding structure layer comprises a power line connected with the pixel driving circuit;
forming an organic insulating layer on the driving structure layer and the binding structure layer, wherein at least one isolation groove is formed on the organic insulating layer on the binding structure layer;
forming a light-emitting element and an isolation dam in the display region and the binding region respectively, wherein the light-emitting element is connected with the pixel driving circuit, and the distance between the isolation groove and an edge of the display region is smaller than the distance between the isolation dam and the edge of the display region; and
forming a composite encapsulation layer and an inorganic encapsulation layer in the display region and the binding region, respectively, wherein the inorganic encapsulation layer covers the isolation groove and wraps the isolation dam;
wherein the power line comprises a first power line and a second power line, and the isolation groove is disposed on the first power line; wherein along the direction of the edge of the display region, an orthographic projection of the isolation groove on a substrate comprises an orthographic projection of the first power line on the substrate; wherein a surface of the first power line is exposed in the isolation groove, and the encapsulation layer covers the exposed surface of the first power line in the isolation groove.

13. The preparation method according to claim 12, wherein
the forming a light-emitting element and an isolation dam in the display region and the binding region respectively comprises: forming a light-emitting element in the display region, wherein the light-emitting element is connected with the pixel driving circuit; and
forming a first isolation dam and a second isolation dam in the binding region, wherein the distance between the first isolation dam and the edge of the display region is smaller than the distance between the second isolation dam and the edge of the display region, and the distance between the isolation groove and the edge of the display region is smaller than the distance between the first isolation dam and the edge of the display region.

14. The preparation method according to claim 13, wherein
forming a light-emitting element in the display region comprises: sequentially forming an anode, a pixel definition layer, an organic light-emitting layer and a cathode on the organic insulating layer, wherein the anode is connected with the pixel driving circuit, the pixel definition layer and the cathode extend to the binding region; and
along the direction away from the display region, the distance between an edge of the cathode and the edge of the display region in the binding region is smaller than the distance between the isolation groove and the edge of the display region.

15. The preparation method according to claim 12, wherein
the width of the isolation groove is 20 μm to 70 μm along the direction away from the display region.

16. The preparation method according to claim 12, wherein
the display substrate further comprises an edge region, and
the preparation method further comprises: forming a circuit structure layer on the edge region, and forming an organic insulating layer on the circuit structure layer, wherein
at least one gap is formed on the organic insulating layer, and the isolation groove of the binding region is communicated with the gap of the edge region and formed by the same process.

17. The preparation method according to claim 12, wherein the binding structure layer of the binding region comprises a composite insulating layer disposed on the substrate and a first power line and a second power line disposed on the composite insulating layer; or, the binding structure layer of the binding region comprises a composite insulating layer disposed on the substrate, a first power line and a second power line disposed on the composite insulating layer, and a fifth insulating layer disposed on the first power line and the second power line; or, the binding structure layer of the binding region comprises a composite insulating layer disposed on the substrate, a fifth insulating layer disposed on the composite insulating layer, a first flat layer disposed on the fifth insulating layer, and a first power line and a second power line disposed on the first flat layer; or, the binding structure layer of the binding region comprises a composite insulating layer disposed on the substrate, a first power line and a second power line disposed on the composite insulating layer, a fifth insulating layer disposed on the first power line and the second power line, and a first flat layer disposed on the fifth insulating layer; or, the binding structure layer of the binding region comprises a composite insulating layer disposed on the substrate, a second connection electrode and a third connection electrode disposed on the composite insulating layer, a fifth insulating layer covering the second connection electrode and the third connection electrode, a first flat layer disposed on the fifth insulating layer, and a first power line and a second power line disposed on the first flat layer, the first power line is connected with the second connection electrode through a via, and the second power line is connected with the third connection electrode through the via;
the organic insulating layer disposed on the binding structure layer comprises a first flat layer or comprises a second flat layer; and
the composite insulating layer comprises a first insulating layer, a second insulating layer, a third insulating layer and a fourth insulating layer which are stacked on the substrate.

18. The preparation method according to claim 12, wherein
an edge of the power line is provided with a wave structure;
the wave structure is disposed on the edge of the power line on one side of the isolation groove away from the display region, or the wave structure is disposed on the edge of the power line on one side of the isolation dam away from the display region, or the wave structure is disposed on the edge of the power line in an area where the power line overlaps with the isolation dam; and
the wave structure comprises a plurality of protrusions disposed at intervals, and a protrusion height of the protrusions is 30 μm to 60 μm.

* * * * *